US009494660B2

(12) United States Patent
David et al.

(10) Patent No.: US 9,494,660 B2
(45) Date of Patent: *Nov. 15, 2016

(54) INTEGRATED CIRCUIT PACKAGE HAVING A SPLIT LEAD FRAME

(71) Applicant: Allegro Microsystems, LLC, Worcester, MA (US)

(72) Inventors: Paul David, Bow, NH (US); William P. Taylor, Amherst, NH (US); P. Karl Scheller, Bow, NH (US); Ravi Vig, Bow, NH (US); Andreas P. Friedrich, Metz-Tessy (FR)

(73) Assignee: Allegro Microsystems, LLC, Worcester, MA (US)

( * ) Notice: Subject to any disclaimer, the term of this patent is extended or adjusted under 35 U.S.C. 154(b) by 261 days.

This patent is subject to a terminal disclaimer.

(21) Appl. No.: 13/749,776

(22) Filed: Jan. 25, 2013

(65) Prior Publication Data

US 2013/0249546 A1    Sep. 26, 2013

Related U.S. Application Data

(63) Continuation-in-part of application No. 13/424,618, filed on Mar. 20, 2012, and a continuation-in-part of application No. 13/748,999, filed on Jan. 24, 2013.

(51) Int. Cl.
*G01R 33/00* (2006.01)
*H01L 23/495* (2006.01)

(52) U.S. Cl.
CPC ........... *G01R 33/00* (2013.01); *G01R 33/0047* (2013.01); *H01L 23/49562* (2013.01);
(Continued)

(58) Field of Classification Search
CPC ............. H01L 23/00; H01L 23/49562; H01L 23/49589; H01L 2224/16245; H01L 2224/32245; H01L 2224/48091; H01L 2224/48247; H01L 2224/48257; H01L 2224/73265; G01R 33/0076; G01R 33/0052; G01R 33/47; G01R 33/0047; G01R 33/00; G01R 33/0011
USPC ........................................ 324/260, 261, 262
See application file for complete search history.

(56) References Cited

U.S. PATENT DOCUMENTS 3,195,043 A   7/1965   Burig et al.
3,281,628 A   10/1966  Bauer et al.
(Continued)

FOREIGN PATENT DOCUMENTS

CH   683 469 A5   3/1994
DE   32 43 039    5/1984
(Continued)

OTHER PUBLICATIONS

Claims as sent to Yuasa and Hara on Oct. 21, 2014; for Japanese Pat. App. No. 2011-539582; 9 pages.
(Continued)

*Primary Examiner* — Melissa Koval
*Assistant Examiner* — Rahul Maini
(74) *Attorney, Agent, or Firm* — Daly, Crowley, Mofford & Durkee, LLP

(57) ABSTRACT

A magnetic field sensor includes a lead frame having a plurality of leads, at least two of which have a connection portion and a die attach portion. A semiconductor die is attached to the die attach portion of the at least two leads. In some embodiments, at least one passive component is attached to the die attach portion of at least two leads.

30 Claims, 8 Drawing Sheets

(52) U.S. Cl.
CPC ..... *H01L23/49589* (2013.01); *G01R 33/0011* (2013.01); *H01L 2224/16245* (2013.01); *H01L 2224/32245* (2013.01); *H01L 2224/48091* (2013.01); *H01L 2224/48247* (2013.01); *H01L 2224/48257* (2013.01); *H01L 2224/73265* (2013.01)

(56) References Cited

U.S. PATENT DOCUMENTS

| | | |
|---|---|---|
| 3,607,528 A | 9/1971 | Gassaway |
| 3,627,901 A | 12/1971 | Happ |
| 3,661,061 A | 5/1972 | Tokarz |
| 3,728,786 A | 4/1973 | Lucas et al. |
| 4,048,670 A | 9/1977 | Eysermans |
| 4,188,605 A | 2/1980 | Stout |
| 4,204,317 A | 5/1980 | Winn |
| 4,210,926 A | 7/1980 | Hacke |
| 4,262,275 A | 4/1981 | DeMarco et al. |
| 4,283,643 A | 8/1981 | Levin |
| 4,315,523 A | 2/1982 | Mahawili et al. |
| 4,409,608 A | 10/1983 | Yoder |
| 4,425,596 A | 1/1984 | Satou |
| 4,542,259 A * | 9/1985 | Butt ............................ 174/528 |
| 4,573,258 A | 3/1986 | Io et al. |
| 4,614,111 A | 9/1986 | Wolff |
| 4,642,716 A | 2/1987 | Wakabayashi et al. |
| 4,670,715 A | 6/1987 | Fuzzell |
| 4,719,419 A | 1/1988 | Dawley |
| 4,733,455 A | 3/1988 | Nakamura et al. |
| 4,745,363 A | 5/1988 | Carr et al. |
| 4,746,859 A | 5/1988 | Malik |
| 4,769,344 A | 9/1988 | Sakai et al. |
| 4,772,929 A | 9/1988 | Manchester |
| 4,789,826 A | 12/1988 | Willett |
| 4,796,354 A | 1/1989 | Yokoyama et al. |
| 4,893,073 A | 1/1990 | McDonald et al. |
| 4,908,685 A | 3/1990 | Shibasaki et al. |
| 4,910,861 A | 3/1990 | Dohogne |
| 4,935,698 A | 6/1990 | Kawaji et al. |
| 4,983,916 A | 1/1991 | Iijima et al. |
| 4,994,731 A | 2/1991 | Sanner |
| 5,010,263 A | 4/1991 | Murata |
| 5,012,322 A | 4/1991 | Guillotte |
| 5,021,493 A | 6/1991 | Sandstrom |
| 5,028,868 A | 7/1991 | Murata et al. |
| 5,041,780 A | 8/1991 | Rippel |
| 5,045,920 A | 9/1991 | Vig et al. |
| 5,068,712 A | 11/1991 | Murakami et al. |
| 5,078,944 A | 1/1992 | Yoshino |
| 5,084,289 A | 1/1992 | Shin et al. |
| 5,121,289 A | 6/1992 | Gagliardi |
| 5,124,642 A | 6/1992 | Marx |
| 5,137,677 A | 8/1992 | Murata |
| 5,139,973 A | 8/1992 | Nagy et al. |
| 5,167,896 A | 12/1992 | Hirota et al. |
| 5,185,919 A | 2/1993 | Hickey |
| 5,196,794 A | 3/1993 | Murata |
| 5,196,821 A | 3/1993 | Partin et al. |
| 5,210,493 A | 5/1993 | Schroeder et al. |
| 5,216,405 A | 6/1993 | Schroeder et al. |
| 5,244,834 A | 9/1993 | Suzuki et al. |
| 5,247,202 A | 9/1993 | Popovic et al. |
| 5,250,925 A * | 10/1993 | Shinkle ...................... 338/32 R |
| 5,286,426 A | 2/1994 | Rano, Jr. et al. |
| 5,289,344 A | 2/1994 | Gagnon et al. |
| 5,315,245 A | 5/1994 | Schroeder et al. |
| 5,332,965 A | 7/1994 | Wolf et al. |
| 5,363,279 A | 11/1994 | Cha |
| 5,399,905 A | 3/1995 | Honda et al. |
| 5,414,355 A | 5/1995 | Davidson et al. |
| 5,434,105 A | 7/1995 | Liou |
| 5,442,228 A | 8/1995 | Pham et al. |
| 5,453,727 A | 9/1995 | Shibasaki et al. |
| 5,479,695 A | 1/1996 | Grader et al. |
| 5,488,294 A | 1/1996 | Liddell et al. |
| 5,491,633 A | 2/1996 | Henry et al. |
| 5,497,081 A | 3/1996 | Wolf et al. |
| 5,500,589 A | 3/1996 | Sumcad |
| 5,500,994 A | 3/1996 | Itaya |
| 5,508,611 A | 4/1996 | Schroeder et al. |
| 5,539,241 A | 7/1996 | Abidi et al. |
| 5,551,146 A | 9/1996 | Kawabata et al. |
| 5,561,366 A | 10/1996 | Takahashi et al. |
| 5,563,199 A | 10/1996 | Harada et al. |
| 5,579,194 A | 11/1996 | Mackenzie et al. |
| 5,581,170 A | 12/1996 | Mammano et al. |
| 5,581,179 A | 12/1996 | Engel et al. |
| 5,612,259 A | 3/1997 | Okutomo et al. |
| 5,614,754 A | 3/1997 | Inoue |
| 5,615,075 A | 3/1997 | Kim |
| 5,627,315 A | 5/1997 | Figi et al. |
| 5,631,557 A | 5/1997 | Davidson |
| 5,648,682 A | 7/1997 | Nakazawa et al. |
| 5,666,004 A | 9/1997 | Bhattacharyya et al. |
| 5,691,637 A | 11/1997 | Oswald et al. |
| 5,691,869 A | 11/1997 | Engel et al. |
| 5,712,562 A | 1/1998 | Berg |
| 5,714,102 A | 2/1998 | Highum et al. |
| 5,714,405 A | 2/1998 | Tsubosaki et al. |
| 5,719,496 A | 2/1998 | Wolf |
| 5,726,577 A | 3/1998 | Engel et al. |
| 5,729,128 A | 3/1998 | Bunyer et al. |
| 5,729,130 A | 3/1998 | Moody et al. |
| 5,757,181 A | 5/1998 | Wolf et al. |
| 5,781,005 A | 7/1998 | Vig et al. |
| 5,789,658 A | 8/1998 | Henn et al. |
| 5,789,915 A | 8/1998 | Ingraham |
| 5,804,880 A | 9/1998 | Mathew |
| 5,817,540 A | 10/1998 | Wark |
| 5,818,222 A | 10/1998 | Ramsden |
| 5,818,223 A | 10/1998 | Wolf |
| 5,822,849 A | 10/1998 | Casali et al. |
| 5,834,832 A | 11/1998 | Kweon et al. |
| 5,839,185 A | 11/1998 | Smith et al. |
| 5,841,276 A | 11/1998 | Makino et al. |
| 5,859,387 A | 1/1999 | Gagnon |
| 5,883,567 A | 3/1999 | Mullins, Jr. |
| 5,886,070 A | 3/1999 | Honkura et al. |
| 5,891,377 A | 4/1999 | Libres et al. |
| 5,912,556 A | 6/1999 | Frazee et al. |
| 5,940,256 A | 8/1999 | MacKenzie et al. |
| 5,943,557 A | 8/1999 | Moden |
| 5,963,028 A | 10/1999 | Engel et al. |
| 5,973,388 A | 10/1999 | Chew et al. |
| 6,005,383 A | 12/1999 | Savary et al. |
| 6,016,055 A | 1/2000 | Jager et al. |
| 6,043,646 A | 3/2000 | Jansseune |
| 6,057,997 A | 5/2000 | MacKenzie et al. |
| 6,066,890 A | 5/2000 | Tsui et al. |
| 6,097,109 A | 8/2000 | Fendt et al. |
| 6,107,793 A | 8/2000 | Yokotani et al. |
| 6,136,250 A | 10/2000 | Brown |
| 6,150,714 A | 11/2000 | Andreycak et al. |
| 6,175,233 B1 | 1/2001 | McCurley et al. |
| 6,178,514 B1 | 1/2001 | Wood |
| 6,180,041 B1 | 1/2001 | Takizawa |
| 6,184,679 B1 | 2/2001 | Popovic et al. |
| 6,198,373 B1 | 3/2001 | Ogawa et al. |
| 6,225,701 B1 | 5/2001 | Hori et al. |
| 6,252,389 B1 | 6/2001 | Baba et al. |
| 6,265,865 B1 | 7/2001 | Engel et al. |
| 6,278,269 B1 | 8/2001 | Vig et al. |
| 6,294,824 B1 | 9/2001 | Brooks et al. |
| 6,316,736 B1 | 11/2001 | Jairazbhoy et al. |
| 6,316,931 B1 | 11/2001 | Nakagawa et al. |
| 6,323,634 B1 | 11/2001 | Nakagawa et al. |
| 6,331,451 B1 | 12/2001 | Fusaro et al. |
| 6,356,068 B1 | 3/2002 | Steiner et al. |
| 6,359,331 B1 | 3/2002 | Rinehart et al. |
| 6,365,948 B1 | 4/2002 | Kumagai et al. |
| 6,377,464 B1 * | 4/2002 | Hashemi et al. ............ 361/760 |
| 6,388,336 B1 | 5/2002 | Venkateshwaran et al. |
| 6,396,712 B1 | 5/2002 | Kuijk |
| 6,411,078 B1 | 6/2002 | Nakagawa et al. |

(56) References Cited

U.S. PATENT DOCUMENTS

| | | |
|---|---|---|
| 6,420,779 B1 | 7/2002 | Sharma et al. |
| 6,424,018 B1 | 7/2002 | Ohtsuka |
| 6,429,652 B1 | 8/2002 | Allen et al. |
| 6,445,171 B2 | 9/2002 | Sandquist et al. |
| 6,452,381 B1 | 9/2002 | Nakatani et al. |
| 6,462,531 B1 | 10/2002 | Ohtsuka |
| 6,480,699 B1 | 11/2002 | Lovoi |
| 6,482,680 B1 | 11/2002 | Khor et al. |
| 6,486,535 B2 | 11/2002 | Liu |
| 6,501,268 B1 | 12/2002 | Edelstein et al. |
| 6,501,270 B1 | 12/2002 | Opie |
| 6,504,366 B2 | 1/2003 | Bodin et al. |
| 6,545,332 B2 | 4/2003 | Huang |
| 6,545,456 B1 | 4/2003 | Radosevich et al. |
| 6,545,457 B2 | 4/2003 | Goto et al. |
| 6,545,462 B2 | 4/2003 | Schott et al. |
| 6,563,199 B2 | 5/2003 | Yasunaga et al. |
| 6,566,856 B2 | 5/2003 | Sandquist et al. |
| 6,580,159 B1 | 6/2003 | Fusaro et al. |
| 6,583,572 B2 | 6/2003 | Veltrop et al. |
| 6,593,545 B1 | 7/2003 | Greenwood et al. |
| 6,605,491 B1 | 8/2003 | Hsieh et al. |
| 6,608,375 B2 | 8/2003 | Terui et al. |
| 6,610,923 B1 | 8/2003 | Nagashima et al. |
| 6,617,846 B2 | 9/2003 | Hayat-dawoodi et al. |
| 6,642,609 B1 | 11/2003 | Minamio et al. |
| 6,642,705 B2 | 11/2003 | Kawase |
| 6,661,087 B2 | 12/2003 | Wu |
| 6,667,682 B2 | 12/2003 | Wan et al. |
| 6,683,448 B1 | 1/2004 | Ohtsuka |
| 6,683,452 B2 | 1/2004 | Lee et al. |
| 6,692,676 B1 | 2/2004 | Vig et al. |
| 6,696,952 B2 | 2/2004 | Zirbes |
| 6,713,836 B2 | 3/2004 | Liu et al. |
| 6,714,003 B2 | 3/2004 | Babin |
| 6,727,683 B2 | 4/2004 | Goto et al. |
| 6,737,298 B2 | 5/2004 | Shim et al. |
| 6,747,300 B2 | 6/2004 | Nadd et al. |
| 6,759,841 B2 | 7/2004 | Goto et al. |
| 6,770,163 B1 | 8/2004 | Kuah et al. |
| 6,775,140 B2 | 8/2004 | Shim et al. |
| 6,781,233 B2 | 8/2004 | Zverev et al. |
| 6,781,359 B2 | 8/2004 | Stauth et al. |
| 6,791,313 B2 | 9/2004 | Ohtsuka |
| 6,796,485 B2 | 9/2004 | Seidler |
| 6,798,044 B2 | 9/2004 | Joshi |
| 6,798,057 B2 | 9/2004 | Bolkin et al. |
| 6,798,193 B2 | 9/2004 | Zimmerman et al. |
| 6,809,416 B1 | 10/2004 | Sharma |
| 6,812,687 B1 | 11/2004 | Ohtsuka |
| 6,825,067 B2 | 11/2004 | Ararao et al. |
| 6,828,220 B2 | 12/2004 | Pendse et al. |
| 6,832,420 B2 | 12/2004 | Liu |
| 6,841,989 B2 | 1/2005 | Goto et al. |
| 6,853,178 B2 | 2/2005 | Hayat-Dawoodi |
| 6,861,283 B2 | 3/2005 | Sharma |
| 6,867,573 B1 | 3/2005 | Carper |
| 6,875,634 B2 | 4/2005 | Shim et al. |
| 6,902,951 B2 | 6/2005 | Goller et al. |
| 6,921,955 B2 | 7/2005 | Goto et al. |
| 6,943,061 B1 | 9/2005 | Sirinorakul et al. |
| 6,960,493 B2 | 11/2005 | Ararao et al. |
| 6,974,909 B2 | 12/2005 | Tanaka et al. |
| 6,989,665 B2 | 1/2006 | Goto et al. |
| 6,995,315 B2 | 2/2006 | Sharma et al. |
| 7,005,325 B2 | 2/2006 | Chow et al. |
| 7,006,749 B2 | 2/2006 | Illch et al. |
| 7,026,808 B2 | 4/2006 | Vig et al. |
| 7,031,170 B2 | 4/2006 | Daeche et al. |
| 7,046,002 B1 | 5/2006 | Edelstein |
| 7,075,287 B1 | 7/2006 | Mangtani et al. |
| 7,105,929 B2 | 9/2006 | Shishido et al. |
| 7,112,955 B2 | 9/2006 | Buchhold |
| 7,112,957 B2 | 9/2006 | Bicking |
| 7,129,569 B2 | 10/2006 | Punzalan et al. |
| 7,129,691 B2 | 10/2006 | Shibahara et al. |
| 7,148,086 B2 | 12/2006 | Shim et al. |
| 7,166,807 B2 | 1/2007 | Gagnon et al. |
| 7,193,412 B2 | 3/2007 | Freeman |
| 7,221,045 B2 | 5/2007 | Park et al. |
| 7,242,076 B2 | 7/2007 | Dolan |
| 7,248,045 B2 | 7/2007 | Shoji |
| 7,250,760 B2 | 7/2007 | Ao |
| 7,259,545 B2 | 8/2007 | Stauth et al. |
| 7,259,624 B2 | 8/2007 | Barnett |
| 7,265,531 B2 | 9/2007 | Stauth et al. |
| 7,269,992 B2 | 9/2007 | Lamb et al. |
| 7,279,424 B2 | 10/2007 | Guthrie et al. |
| 7,279,784 B2 | 10/2007 | Liu |
| 7,285,952 B1 | 10/2007 | Hatanaka et al. |
| 7,304,370 B2 | 12/2007 | Imaizumi et al. |
| 7,323,780 B2 | 1/2008 | Daubenspeck et al. |
| 7,323,870 B2 | 1/2008 | Tatschl et al. |
| 7,355,388 B2 | 4/2008 | Ishio |
| 7,358,724 B2 | 4/2008 | Taylor et al. |
| 7,361,531 B2 | 4/2008 | Sharma et al. |
| 7,378,721 B2 | 5/2008 | Frazee et al. |
| 7,378,733 B1 | 5/2008 | Hoang et al. |
| 7,385,394 B2 | 6/2008 | Auburger et al. |
| 7,476,816 B2 | 1/2009 | Doogue et al. |
| 7,476,953 B2 | 1/2009 | Taylor et al. |
| 7,518,493 B2 | 4/2009 | Byzek et al. |
| 7,557,563 B2 | 7/2009 | Gunn et al. |
| 7,573,112 B2 | 8/2009 | Taylor |
| 7,598,601 B2 | 10/2009 | Taylor et al. |
| 7,676,914 B2 | 3/2010 | Taylor |
| 7,687,882 B2 | 3/2010 | Taylor et al. |
| 7,696,006 B1 | 4/2010 | Hoang et al. |
| 7,700,404 B2 | 4/2010 | Punzalan et al. |
| 7,709,754 B2 | 5/2010 | Doogue et al. |
| 7,750,447 B2 | 7/2010 | Chang et al. |
| 7,768,083 B2 | 8/2010 | Doogue et al. |
| 7,777,607 B2 | 8/2010 | Talor et al. |
| 7,808,074 B2 | 10/2010 | Knittl |
| 7,816,772 B2 | 10/2010 | Engel et al. |
| 7,816,905 B2 | 10/2010 | Doogue et al. |
| 7,838,973 B2 | 11/2010 | Dimasacat et al. |
| 7,839,141 B2 | 11/2010 | Werth et al. |
| 7,956,604 B2 | 6/2011 | Ausserlechner |
| 8,030,918 B2 | 10/2011 | Doogue et al. |
| 8,035,204 B2 | 10/2011 | Punzalan et al. |
| 8,058,870 B2 | 11/2011 | Sterling |
| 8,063,634 B2 | 11/2011 | Sauber et al. |
| 8,080,993 B2 | 12/2011 | Theuss et al. |
| 8,080,994 B2 | 12/2011 | Taylor et al. |
| 8,093,670 B2 | 1/2012 | Taylor |
| 8,106,654 B2 | 1/2012 | Theuss et al. |
| 8,138,593 B2 | 3/2012 | Pagkaliwangan et al. |
| 8,143,169 B2 | 3/2012 | Engel et al. |
| 8,207,602 B2 | 6/2012 | Chang et al. |
| 8,236,612 B2 | 8/2012 | San Antonio et al. |
| 8,253,210 B2 | 8/2012 | Theuss et al. |
| 8,362,579 B2 | 1/2013 | Theuss et al. |
| 8,461,677 B2 | 6/2013 | Ararao et al. |
| 8,486,755 B2 | 7/2013 | Ararao et al. |
| 8,610,430 B2 | 12/2013 | Werth et al. |
| 8,629,539 B2 | 1/2014 | Milano et al. |
| 8,773,124 B2 | 7/2014 | Ausserlechner |
| 9,116,018 B2 | 8/2015 | Frachon |
| 9,164,156 B2 | 10/2015 | Elian et al. |
| 9,201,123 B2 | 12/2015 | Elian et al. |
| 2001/0028115 A1 | 10/2001 | Yanagawa et al. |
| 2001/0030537 A1 | 10/2001 | Honkura et al. |
| 2001/0052780 A1 | 12/2001 | Hayat-Dawoodi |
| 2002/0005780 A1 | 1/2002 | Ehrlich et al. |
| 2002/0020907 A1 | 2/2002 | Seo et al. |
| 2002/0027488 A1 | 3/2002 | Hayat-Dawoodi et al. |
| 2002/0041179 A1 | 4/2002 | Gohara et al. |
| 2002/0068379 A1* | 6/2002 | Cobbley et al. ............... 438/106 |
| 2002/0153599 A1* | 10/2002 | Chang et al. ................. 257/676 |
| 2002/0179987 A1 | 12/2002 | Meyer et al. |
| 2002/0195693 A1 | 12/2002 | Liu et al. |
| 2003/0038464 A1 | 2/2003 | Furui |
| 2003/0039062 A1 | 2/2003 | Takahasahi |

(56) References Cited

U.S. PATENT DOCUMENTS

| | | |
|---|---|---|
| 2003/0067057 A1 | 4/2003 | Wu |
| 2003/0164548 A1 | 9/2003 | Lee |
| 2003/0209784 A1 | 11/2003 | Schmitz et al. |
| 2003/0230792 A1 | 12/2003 | Wu et al. |
| 2004/0032251 A1 | 2/2004 | Zimmerman et al. |
| 2004/0038452 A1 | 2/2004 | Pu |
| 2004/0046248 A1 | 3/2004 | Waelti et al. |
| 2004/0056647 A1 | 3/2004 | Stauth et al. |
| 2004/0080308 A1 | 4/2004 | Goto |
| 2004/0080314 A1 | 4/2004 | Tsujii et al. |
| 2004/0094826 A1 | 5/2004 | Yang et al. |
| 2004/0135220 A1 | 7/2004 | Goto |
| 2004/0135574 A1 | 7/2004 | Hagio et al. |
| 2004/0145043 A1 | 7/2004 | Hayashi et al. |
| 2004/0155644 A1 | 8/2004 | Stauth et al. |
| 2004/0174655 A1 | 9/2004 | Tsai et al. |
| 2004/0184196 A1 | 9/2004 | Jayasekara |
| 2004/0207035 A1 | 10/2004 | Witcraft et al. |
| 2004/0207077 A1 | 10/2004 | Leal et al. |
| 2004/0207398 A1 | 10/2004 | Kudo et al. |
| 2004/0207400 A1 | 10/2004 | Witcraft et al. |
| 2004/0212053 A1 | 10/2004 | Koh et al. |
| 2004/0262718 A1 | 12/2004 | Ramakrishna |
| 2004/0263148 A1 | 12/2004 | Takabatake |
| 2005/0035448 A1 | 2/2005 | Hsu et al. |
| 2005/0040814 A1 | 2/2005 | Vig et al. |
| 2005/0045359 A1 | 3/2005 | Doogue et al. |
| 2005/0139972 A1 | 6/2005 | Chiu et al. |
| 2005/0151448 A1 | 7/2005 | Hikida et al. |
| 2005/0167790 A1 | 8/2005 | Khor et al. |
| 2005/0173783 A1 | 8/2005 | Chow et al. |
| 2005/0194676 A1 | 9/2005 | Fukuda et al. |
| 2005/0224248 A1 | 10/2005 | Gagnon et al. |
| 2005/0230843 A1 | 10/2005 | Williams |
| 2005/0236698 A1 | 10/2005 | Ozawa et al. |
| 2005/0248005 A1 | 11/2005 | Hayat-Dawoodi |
| 2005/0248336 A1* | 11/2005 | Sharma ................ G01R 15/202 324/117 H |
| 2005/0253230 A1 | 11/2005 | Punzalan et al. |
| 2005/0253507 A1 | 11/2005 | Fujimura et al. |
| 2005/0266611 A1 | 12/2005 | Tu et al. |
| 2005/0270748 A1 | 12/2005 | Hsu |
| 2005/0274982 A1 | 12/2005 | Ueda et al. |
| 2005/0280411 A1 | 12/2005 | Bicking |
| 2006/0002147 A1 | 1/2006 | Hong et al. |
| 2006/0033487 A1 | 2/2006 | Nagano et al. |
| 2006/0038289 A1 | 2/2006 | Hsu et al. |
| 2006/0038560 A1 | 2/2006 | Kurumado |
| 2006/0068237 A1 | 3/2006 | Murphy |
| 2006/0071655 A1 | 4/2006 | Shoji |
| 2006/0077598 A1 | 4/2006 | Taylor et al. |
| 2006/0091993 A1 | 5/2006 | Shoji |
| 2006/0114098 A1 | 6/2006 | Shoji |
| 2006/0125473 A1 | 6/2006 | Frachon et al. |
| 2006/0145690 A1 | 7/2006 | Shoji |
| 2006/0152210 A1 | 7/2006 | Mangtani et al. |
| 2006/0170529 A1 | 8/2006 | Shoji |
| 2006/0175674 A1 | 8/2006 | Taylor |
| 2006/0181263 A1 | 8/2006 | Doogue et al. |
| 2006/0219436 A1 | 10/2006 | Taylor et al. |
| 2006/0232268 A1 | 10/2006 | Arns, Jr. et al. |
| 2006/0238190 A1* | 10/2006 | Ishio .......................... 324/207.21 |
| 2006/0255797 A1 | 11/2006 | Taylor et al. |
| 2006/0261801 A1 | 11/2006 | Busch |
| 2006/0267135 A1 | 11/2006 | Wolfgang et al. |
| 2006/0291106 A1 | 12/2006 | Shoji |
| 2007/0007631 A1 | 1/2007 | Knittl |
| 2007/0018290 A1 | 1/2007 | Punzalan et al. |
| 2007/0018642 A1 | 1/2007 | Ao |
| 2007/0044370 A1 | 3/2007 | Shoji |
| 2007/0076332 A1 | 4/2007 | Shoji |
| 2007/0090825 A1 | 4/2007 | Shoji |
| 2007/0099348 A1 | 5/2007 | Sharma et al. |
| 2007/0126088 A1 | 6/2007 | Frazee et al. |
| 2007/0138651 A1 | 6/2007 | Hauenstein |
| 2007/0170533 A1 | 7/2007 | Doogue et al. |
| 2007/0188946 A1 | 8/2007 | Shoji |
| 2007/0241423 A1 | 10/2007 | Taylor et al. |
| 2007/0243705 A1 | 10/2007 | Taylor |
| 2007/0279053 A1 | 12/2007 | Taylor et al. |
| 2008/0013298 A1* | 1/2008 | Sharma et al. ................ 361/813 |
| 2008/0018261 A1 | 1/2008 | Kastner |
| 2008/0034582 A1 | 2/2008 | Taylor |
| 2008/0036453 A1 | 2/2008 | Taylor |
| 2008/0116884 A1 | 5/2008 | Rettig et al. |
| 2008/0230879 A1 | 9/2008 | Sharma et al. |
| 2008/0237818 A1 | 10/2008 | Engel et al. |
| 2008/0297138 A1 | 12/2008 | Taylor et al. |
| 2009/0001965 A1 | 1/2009 | Ausserlechner et al. |
| 2009/0058412 A1 | 3/2009 | Taylor et al. |
| 2009/0102034 A1 | 4/2009 | Pagkaliwangan et al. |
| 2009/0121704 A1 | 5/2009 | Shibahara |
| 2009/0122437 A1 | 5/2009 | Gong et al. |
| 2009/0140725 A1 | 6/2009 | Ausserlechner |
| 2009/0152696 A1 | 6/2009 | Dimasacat et al. |
| 2009/0294882 A1 | 12/2009 | Sterling |
| 2010/0019332 A1 | 1/2010 | Taylor |
| 2010/0140766 A1 | 6/2010 | Punzalan et al. |
| 2010/0141249 A1* | 6/2010 | Ararao et al. ................ 324/244 |
| 2010/0188078 A1 | 7/2010 | Foletto |
| 2010/0201356 A1 | 8/2010 | Koller et al. |
| 2010/0211347 A1 | 8/2010 | Friedrich et al. |
| 2010/0237450 A1 | 9/2010 | Doogue et al. |
| 2010/0276769 A1 | 11/2010 | Theuss et al. |
| 2010/0295140 A1 | 11/2010 | Theuss et al. |
| 2010/0330708 A1 | 12/2010 | Engel et al. |
| 2011/0050222 A1 | 3/2011 | Ueno et al. |
| 2011/0068447 A1 | 3/2011 | Camacho et al. |
| 2011/0111562 A1 | 5/2011 | San Antonio et al. |
| 2011/0127998 A1* | 6/2011 | Elian et al. .................. 324/219 |
| 2011/0133732 A1 | 6/2011 | Sauber |
| 2011/0175598 A1 | 7/2011 | Doering et al. |
| 2011/0187350 A1 | 8/2011 | Ausserlechner et al. |
| 2011/0204887 A1 | 8/2011 | Ausserlechner et al. |
| 2011/0267040 A1 | 11/2011 | Frachon |
| 2011/0304327 A1 | 12/2011 | Ausserlechner |
| 2012/0013333 A1 | 1/2012 | Ararao et al. |
| 2012/0038352 A1 | 2/2012 | Elian et al. |
| 2012/0077353 A1* | 3/2012 | Shedletsky ..................... 439/55 |
| 2012/0086090 A1* | 4/2012 | Sharma et al. ................ 257/421 |
| 2013/0113474 A1 | 5/2013 | Elian |
| 2013/0113475 A1 | 5/2013 | Elian et al. |
| 2013/0249027 A1* | 9/2013 | Taylor et al. ................. 257/421 |
| 2013/0249029 A1* | 9/2013 | Vig et al. ..................... 257/427 |
| 2013/0249546 A1* | 9/2013 | David et al. .................. 324/260 |
| 2013/0278246 A1 | 10/2013 | Stegerer et al. |
| 2014/0320124 A1* | 10/2014 | David et al. .................. 324/252 |

FOREIGN PATENT DOCUMENTS

| | | |
|---|---|---|
| DE | 4 141 386 | 6/1993 |
| DE | 102 31 194 | 2/2004 |
| DE | 103 14 602 | 10/2004 |
| DE | 103 14 602 A1 | 10/2004 |
| DE | 10 2004 054317 | 5/2006 |
| DE | 10 2004 060 298 | 6/2006 |
| DE | 10 2004 060 298 A1 | 6/2006 |
| DE | 10 2004 060298 A1 | 6/2006 |
| DE | 10 2007 018 238 A1 | 10/2008 |
| DE | 10 2008 064047 A1 | 4/2010 |
| DE | 10 2009 000 460 A1 | 7/2010 |
| EP | 0 244 737 | 11/1987 |
| EP | 0 361 456 | 4/1990 |
| EP | 0 361 456 A2 | 4/1990 |
| EP | 0409173 A2 | 1/1991 |
| EP | 0 537 419 | 4/1993 |
| EP | 0 680 103 A1 | 11/1995 |
| EP | 0 867 725 | 9/1998 |
| EP | 0 896 180 | 2/1999 |
| EP | 0 898 180 | 2/1999 |
| EP | 0 898 180 A2 | 2/1999 |
| EP | 0944839 | 9/1999 |
| EP | 0 680 103 B1 | 2/2000 |
| EP | 1 107 327 | 6/2001 |

(56) References Cited

FOREIGN PATENT DOCUMENTS

| | | |
|---|---|---|
| EP | 1 107 328 | 6/2001 |
| EP | 1 111 693 | 6/2001 |
| EP | 1160887 A2 | 12/2001 |
| EP | 1 180 804 | 2/2002 |
| EP | 1281974 | 2/2003 |
| EP | 1 443 332 | 4/2004 |
| EP | 1 443 332 A1 | 8/2004 |
| EP | 0898180 B1 | 11/2004 |
| EP | 2366976 A1 | 9/2011 |
| FR | 2 748 105 | 10/1997 |
| GB | 2 191 632 | 12/1987 |
| GB | 2273782 | 6/1994 |
| JP | S 47-12071 | 4/1972 |
| JP | S 58-501372 | 8/1983 |
| JP | 61-71649 | 4/1986 |
| JP | S 62-260374 | 11/1987 |
| JP | S63-051647 | 3/1988 |
| JP | 363 084176 A | 4/1988 |
| JP | 63-191069 | 8/1988 |
| JP | 63-263782 | 10/1988 |
| JP | 1 184885 | 7/1989 |
| JP | H 01-184885 | 7/1989 |
| JP | 01207909 | 8/1989 |
| JP | H2-124575 | 10/1990 |
| JP | H03-71073 A | 3/1991 |
| JP | 04-152688 | 5/1992 |
| JP | H4-97370 | 8/1992 |
| JP | 04-329682 | 11/1992 |
| JP | 4-357858 A | 12/1992 |
| JP | 4-364472 | 12/1992 |
| JP | H04-357858 | 12/1992 |
| JP | 05-206185 | 8/1993 |
| JP | H 06-055971 | 3/1994 |
| JP | 8-97486 | 4/1996 |
| JP | 08-097486 | 4/1996 |
| JP | 8-264569 | 10/1996 |
| JP | 8-264569 A | 10/1996 |
| JP | H08-264569 | 10/1996 |
| JP | 09-079865 | 3/1997 |
| JP | 90979865 | 3/1997 |
| JP | 09-166612 | 6/1997 |
| JP | H10-022422 | 1/1998 |
| JP | 11-074142 | 3/1999 |
| JP | 2000-058740 | 2/2000 |
| JP | 2000-174357 | 6/2000 |
| JP | 2000-183241 A | 6/2000 |
| JP | 2000-183241 A | 6/2000 |
| JP | 2000-294692 | 10/2000 |
| JP | 2004-055932 | 2/2001 |
| JP | 2001-116815 | 4/2001 |
| JP | 2001-141738 | 5/2001 |
| JP | 2001-141738 A | 5/2001 |
| JP | 2001-165702 | 6/2001 |
| JP | 2001-165963 | 6/2001 |
| JP | 2001-174486 | 6/2001 |
| JP | 2001-1665702 | 6/2001 |
| JP | 2001-230467 | 8/2001 |
| JP | 2001-289865 A | 10/2001 |
| JP | 2001-339109 | 12/2001 |
| JP | 2002-026419 | 1/2002 |
| JP | 2002-040058 | 2/2002 |
| JP | 2002-189069 | 7/2002 |
| JP | 2002-202306 | 7/2002 |
| JP | 2002-202327 | 7/2002 |
| JP | 2003-177168 | 6/2003 |
| JP | 2003-177171 | 6/2003 |
| JP | 2004-55932 | 2/2004 |
| JP | 2004 055932 A | 2/2004 |
| JP | 2004-55932 A | 2/2004 |
| JP | 2004055932 | 2/2004 |
| JP | 2004-356338 | 12/2004 |
| JP | 2005-327859 | 11/2005 |
| JP | 2005-337866 | 12/2005 |
| JP | 2005-345302 | 12/2005 |
| JP | 2006-047113 | 2/2006 |
| JP | 2006-164528 | 6/2006 |
| JP | 2007-218799 | 8/2007 |
| JP | 2001 116815 | 4/2014 |
| WO | WO 83/00949 | 3/1983 |
| WO | WO 9007176 | 6/1990 |
| WO | WO 99/14605 | 3/1999 |
| WO | WO 99/14605 A1 | 3/1999 |
| WO | WO 0054068 | 9/2000 |
| WO | WO 0069045 | 11/2000 |
| WO | WO 01/23899 | 4/2001 |
| WO | WO 01/74139 | 10/2001 |
| WO | WO 03/107018 A1 | 12/2003 |
| WO | WO 2004/027436 | 4/2004 |
| WO | WO 2005/013363 | 2/2005 |
| WO | WO 2005/026749 | 3/2005 |
| WO | WO 2006/037695 A1 | 4/2006 |
| WO | WO 2006-060330 | 6/2006 |
| WO | WO 2006/083479 | 8/2006 |
| WO | WO 2008/008140 A2 | 1/2008 |
| WO | WO 2008/008140 A3 | 1/2008 |
| WO | WO 2008/121443 A1 | 10/2008 |
| WO | WO 2010/065315 | 6/2010 |
| WO | WO 2013/142112 | 7/2013 |
| WO | WO 2013/109355 | 9/2013 |
| WO | WO 2013/141981 | 9/2013 |

OTHER PUBLICATIONS

Claims as filed on Oct. 28, 2014 by Yuasa and Hara, for Japanese Pat. App. No. 2011-539582; 5 pages.
Chinese Office Action from Chinese Patent Application No. 201110285150.8, including English translation, 15 pages.
Response to Chinese Office Action filed on Dec. 16, 2013 from Chinese Patent Application No. 201110285150.8, including Applicant's instruction letter to foreign associate, foreign associate emailed response and foreign associate cover letter attached to filed response, 11 pages.
Office Action dated Jan. 28, 2014, for U.S. Appl. No. 13/838,864; 35 pages.
Korean Patent Application No. 10-2009-7021132 Email from foreign associate dated Apr. 1, 2014 regarding office action received and listing of references from office action, 2 pages.
Office Action dated Jul. 17, 2014 for U.S. Appl. No. 13/838,131, filed Mar. 15, 2013.
Office Action dated Jul. 17, 2014 for U.S. Appl. No. 13/838,864, filed Mar. 15, 2013.
Office Action dated Aug. 4, 2014 for U.S. Appl. No. 12/360,899, filed Jan. 28, 2009 15 pages.
Japanese Office Action dated Jun. 19, 2014; with English Translation, for Japanese Pat. App. No. 2011-539582; 8 pages.
Notification, Search Report and Written Opinion dated Sep. 3, 2013 for PCT Application No. PCT/US2013/030112, filed Mar. 11, 2013, 29 pages.
Notification, Search Report and Written Opinion dated Sep. 25, 2013 for PCT Application No. PCT/US2013/025858, filed Feb. 13, 2013, 37 pages.
Response to Office Action; filed Sep. 30, 2013; to Office Action dated Jun. 28, 2013; for U.S. Appl. No. 12/360,889; 15 pages.
Korean Patent Application No. 10-2009-7021132 Notice of Allowance dated Sep. 26, 2014, including translation, 6 pages.
Office Action dated Oct. 6, 2014; for U.S. Appl. No. 13/838,864; 26 pages.
Office Action dated Oct. 2, 2014; for U.S. Appl. No. 13/838,131; 29 pages.
Final Office Action dated Mar. 11, 2014; for U.S. Appl. No. 12/360,889 23 pages.
Korean Patent Application No. 10-2009-7021132 Office Action dated Mar. 28, 2014, including partial translation on foreign associate email dated Apr. 1, 2014, 11 pages.
Office Action dated Mar. 24, 2015; for U.S. Appl. No. 13/838,864; 25 pages.
Response filed Feb. 20, 2015; to Office Action dated Oct. 6, 2014; for U.S. Appl. No. 13/838,864; 15 pages.

(56) References Cited

OTHER PUBLICATIONS

Response filed Feb. 20, 2015; to Office Action dated Oct. 2, 2014; for U.S. Appl. No. 13/838,131; 18 pages.
Chinese Patent Application No. 201110285150.8 Notice of Granting Patent Right for Invention dated Apr. 17, 2014, including English transiation, 4 pages.
Japanese Patent Application No. 2010-501028 Allowance Report dated May 7, 2014, with foreign associate cover letter, 4 pages.
Response filed Sep. 23, 2014 to Office Action dated Jul. 17, 2014; for U.S. Appl. No. 13/838,864; 18 pages.
Request for Continued Examination filed Sep. 23, 2014; for U.S. Appl. No. 13/838,864; 2 pages.
Response filed Sep. 23, 2014 to Office Action dated Jul. 17, 2014; for U.S. Appl. No. 13/838,131; 20 pages.
Request for Continued Examination filed Sep. 23, 2014; for U.S. Appl. No. 13/838,131; 2 pages.
International Preliminary Report on Patentability dated Oct. 2, 2014 for PCT Application PCT/US2013/025858; 30 pages.
International Preliminary Report on Patentability dated Oct. 2, 2014 for PCT Application No. PCT/US2013/030112; 20 pages.
Letter from Yuasa and Hara dated Oct. 29, 2013; for Japanese Pat. App. No. 2011-539582; 2 pages.
Response to Office Action (with Claims in English) filed Oct. 15, 2013; for Japanese Pat. App. No. 2011-539582; 13 pages.
Office Action dated Nov. 14, 2014 for U.S. Appl. No. 13/871,131; 17 pages.
Office Action dated Jan. 9, 2014; for U.S. Appl. No. 13/838,131; 35 pages.
International Search Report and Written Opinion dated Jul. 28, 2014 for PCT Application No. PCT/US2014/032125; 18 pages.
Office Action dated Aug. 1, 2014 for U.S. Appl. No. 13/871,131; 41 pages.
Response as filed on Sep. 26, 2014 for U.S. Appl. No. 13/871,131; 14 pages.
Response filed Jun. 23, 2014; of Office Action dated Mar. 11, 2014 for U.S. Appl. No. 12/360,889 11 pages.
Korean Patent Application No. 10-2009-7021132 Response and Amendment filed May 27, 2014, including translation of Amended Claims, Email from Foreign Associate dated Apr. 29, 2014 providing comments, Email to Foreign Associate dated May 23, 2014 providing instruction to amend claims, letter from Foreign Associate instructing Response and Amendment filed May 27, 2014.
U.S. Appl. No. 13/468,478, filed May 10, 2012, Pepka et al.
PCT Search Report & Written Opinion for PCT/US2006/000363 dated May 11, 2006.
Japanese Office Action (full translation) received Jul. 26, 2012; for JP Pat. App. No. 2010-501028; 5 pages.
Letter from Yuasa & Hara; dated Oct. 16, 2012; for JP Pat. App. No. 2010-501028; 6 pages.
Japanese Response to Office Action; for JP Pat. App. No. 2010-501028; 6 pages.
CN Office Action (w/English translation); dated Sep. 10, 2010; for CN Pat. App. No. CN 2008 800088956; 14 pages.
PCT Search Report and Written Opinion of the ISA for PCT/US2008/053551; dated Jul. 15, 2008; 11 pages.
PCT International Preliminary Report on Patentability for PCT/US2008/053551; dated Oct. 8, 2009; 7 pages.
U.S. Appl. No. 12/878,134.
Office Action; dated Jun. 7, 2012; for U.S. Appl. No. 12/360,889; 9 pages.
Response to Office Action; dated Sep. 27, 2012; for U.S. Appl. No. 12/360,889; 12 pages.
Office Action; dated Jan. 18, 2013; for U.S. Appl. No. 12/360,889; 7 pages.
Response to Office Action; dated Apr. 15, 2013; for U.S. Appl. No. 12/360,889; 7 pages.
U.S. Appl. No. 12/360,889, filed Jan. 28, 2009.
PCT Search Report and Written Opinion for PCT/US2009/065044 dated Jan. 7, 2010.

PCT International Preliminary Report on Patentability and Written Opinion of the ISA; dated Jun. 7, 2011; for PCT Pat. App. No. PCT/US2009/065044; 7 pages.
U.S. Appl. No. 12/328,798.
U.S. Appl. No. 13/241,380.
U.S. Appl. No. 13/350,970, filed Jan. 16, 2012; 47 pages.
"Gear-Tooth Sensor for Automotive Applications," Allegro Microsystems, Inc., Aug. 3, 2001.
Allegro "Two-Wire True Zero Speed Miniature Differential Peak-Detecting Gear Tooth Sensor;" ATS645LSH; 2004; Allegro MicroSystems, Inc., Worcester, MA 01615; pp. 1-14.
Allegro MicroSystems, Inc., Hall-Effect IC Applications Guide, http://www.allegromicro.com/en/Products/Design/an/an27701.pdf, Copyright 1987, 1997, pp. 1-36.
Alllegro "True Zero-Speed Low-Jitter High Accuracy Gear Tooth Sensor;" ATS625LSG; 2005; Allegro MicroSystems, Inc. Worcester, MA 01615; pp. 1-21.
Bowers et al., "Microfabrication and Process Integration of Powder-Based Permanent Magnets", Interdisciplinary Microsystems Group, Dept. Electrical and Computer Engineering, University of Florida, USA; Technologies for Future Micro-Nano Manufacturing Workshop, Napa, California, Aug. 8-10, 2011, pp. 162-165.
Dwyer, "Back-Biased Packaging Advances (SE, SG & SH versus SA & SB)," http://www.allegromicro.com/en/Products/Design/packaging_advances/index.asp, Copyright 2008, pp. 1-5.
Honeywell International, Inc., "Hall Effect Sensing and Application," Micro Switch Sensing and Control, Chapter 3, http://content.honeywell.com/sensing/prodinfo/solidstate/technical/hallbook.pdf, date unavailable but believed to be before Jan. 2008, pp. 9-18.
Infineon Product Brief, TLE 4941plusC, Differential Hall IC for Wheel Speed Sensing, Oct. 2010, www.infineon.com/sensors, 2 pages.
Johnson et al., "Hybrid Hall Effect Device," Appl. Phys. Lett., vol. 71, No. 7, Aug. 1997, pp. 974-976.
Legorce et al.; "Magnetic and Mechanical Properties of Micromachined Strontium Ferrite/Polyimide Composites;" Journal of Microelectromechanical Systems; vol. 6, No. 4; Dec. 1997; pp. 307-312.
Lequesne et al.; "High-Accuracy Magnetic Position Encoder Concept;" IEEE Transactions on Industry Applications; vol. 35, No. 3; May/Jun. 1999; pp. 568-576.
Melexis Microelectronic Systems, Hall Applications Guide, Section 3—Applications, 1997 (48 pages).
Oniku et al., "High-Energy-Density Permanent Micromagnets Formed From Heterogeneous Magnetic Powder Mixtures", Interdiscipilnary Microsystems Group, Dept. of Electrical and Computer Engineering, University of Florida, Gainesville, FL 32611, USA; Preprint of MEMS 2012 Conf. Paper, 4 pages.
Park et al.; "Ferrite-Based Integrated Planar Inductors and Transformers Fabricated at Low Temperature;" IEEE Transactions on Magnetics; vol. 33, No. 5; Sep. 1997; pp. 3322-3324.
Letter to Yuasa and Hara dated Jun. 11, 2015; for Japanese Pat. App. No. 2011-539582; 7 pages.
Letter from Yuasa and Hara dated Jun. 19, 2015; for Japanese Pat. App. No. 2011-539582; 1 page.
Japanese Argument and Amendment (including Claims in English) filed Jun. 16, 2015; for Japanese Pat. App. No. 2011-539582; 10 pages.
Final Office Action dated Apr. 2, 2015; for U.S. Appl. No. 13/838,131; 25 pages.
Japanese Notice of Reasons for Rejection (English translation) dated Mar. 31, 2015; for Japanese Pat. App. No. 2011-539582; 2 pages.
Office Action dated Jun. 19, 2015 for U.S. Appl. No. 13/871,131; 18 pages.
Response to Office Action filed Jul. 15, 2015 U.S. Appl. No. 13/424,618.; 14 pages.
Response to Office Action filed Jul. 15, 2015 U.S. Appl. No. 13/788,210; 9 pages.
Response to Office Action filed Jul. 15, 2015 U.S. Appl. No. 13/871,131; 19 pages.
Office action dated May 31, 2013 for U.S. Appl. No. 13/350,970; 5 pages.

(56) References Cited

OTHER PUBLICATIONS

Response to Office Action filed Jun. 19, 2013 for U.S. Appl. No. 13/350,970;7 pages.
Notice of Allowance dated Sep. 3, 2013 for U.S. Appl. No. 13/350,970;10 pages.
Restriction Requirement dated Jul. 15, 2014 for U.S. Appl. No. 13/350,970; 7 pages.
Response to Restriction Requirement filed Jul. 29, 2014 for U.S. Appl. No. 14/090,037;1 pages.
Office action dated Aug. 14, 2014 for U.S. Appl. No. 14/090,037; 7 pages.
Amendment filed Dec. 18, 2014 for U.S. Appl. No. 14/090,037; 9 pages.
Final Office Action dated Feb. 24, 2015; for U.S. Appl. No. 14/090,037; 13 pages.
Response filed Jan. 13, 2015 for EP Application EP12809921.5; 18 pages.
Response filed on Jan. 28, 2015 for U.S. Appl. No. 13/871,131; 20 pages.
Request for Continued Examination filed on Jan. 28, 2015 for U.S. Appl. No. 13/871,131; 2 pages.
Notice of Allowance dated Feb. 18, 2015 for U.S. Appl. No. 13/871,131;9 pages.
Hashemi, "The Close Attached Capacitor; A Solution to Switching Noise Problems" IEEE Transactions on Components, Hybrids, and Manufacturing Technologies, IEEE New York, US vol. 15, No. 6, Dec. 1, 1992 8 pages.
Infineon Technologies, "Differential Two-Wire Hall Effect Sensor-IC for Wheel Speed Applications with Direction Detection" Feb. 2005, Data Sheet. vol. 3.1, 32 pages.
Infineon Technologies, "Smart Hall Effect Sensor for Camshaft Applications", 2003 Infineon Technologies AG, Germany 2 pages.
Motz et al., "A chopped Hall Sensor with Small Jitter and Programmable "True Power-On" Function", IEEE Journal of Solid State Circuits, vol. 40, No. 7, Jul. 2005 8 pages.
Wibben J. et al., "A High-Efficiency DC-DC Converter Using 2nH Integrated Inductors", IEEE Journal of Solid State Circuits, IEEE Service Center, Piscataway, NJ, col. 43, No. 4, Apr. 1, 2008 11 pages.
Arnold et al., "Hall Effect Detector and Miniswitch;" IBM Technical Disclosure Bulletin; vol. 17, No. 11; Apr. 1975; 1 page.
Baltes; "Future of IC Microtransducers;" Sensors & Actuators A, Elsevier Sequoia S.A Lausanne; No. 1; Aug. 1996; 14 pages.
Blanchard et al.; "Highly Sensitive Hall Sensor in CMOS Technology." Sensors & Actuators A, Elsevier Sequoia S.A Lausanne, CH; vol. 85, No. 1-3; May 2000; 5 pages.
Cheng et al.; "Effects of Spacer Layeron Growth Stress& Magnetic Properties of Sputtered Permalloy Film;" Journal of Magnetism and Magnetic Materials; Elsevier Science Publishers, Amsterdam, NL; vol. 282; Nov. 2004; 6 pages.
Daughton; "GMR & SDT Sensor Applications;" IEEE Transactions on Magnetics, vol. 36, No. 5; Sep. 2000; 6 pages.
Edelstein et al.; "Minimizing 1/ƒNoise in Magnetic Sensors Using a Microelectromechanical Systems Flux Concentrator," Journal of Applied Physics; American Institute of Physics; New York, US vol. 91. No. 10, May 15, 2002; 3 pages.
Frick et al.; "40.2: CMOS Microsystems for AC Current Measurement with Galvanic Isolation;" Proceedings of IEEE Sensors 2002; IEEE Int'l Conference on Sensors; New York, NY vol. 1 of 2, Conf. 1; Jun. 12, 2002; 9 pages.
Katyl; "Edge-Mounted Hall Cell Sensor;" IBM Technical Disclosure Bulletin; vol. 22, No. 8A; Jan. 1, 1980; 1 page.
Katyl; "Flux Concentrator for Magnetic Field Sensor Transistor," Ip.com Journal, ip.com Inc., West Henrietta, NY; Jun. 1, 1980; 3 Pages.
Leichle et al.; "A Micromachined Resonant Magnetic Field Sensor," Proceedings of the IEEE 14th Annual Int'l Conference on Microelectio Mechanical Systems, MEMS 2001; Interlaken, SH; Jan. 21, 2001; 4 pages.

Popovic et al.; "Integrated Hall Sensor/ Flux Concentrator Microsystems," Informacije Midem; Ljubljana, SI; Oct. 10, 2001; 5 pages.
Popovic,; "Not-Plate-Like Hall Magnetic Sensors and their Applications," Sensors & Actuators A, Elsevier Sequoia S.A Lausanne; CH; vol. 85, No. 1-3; Aug. 25, 2000; 9 pages.
Schneider et al.; "Intergrated Flux Concentrator improves CMOS Magnetotransistors," Proceedings of the Workshop on Micro Electrical Mechanical Systems; NL; Jan. 29, 1995;6 pages.
Lee et al.; "Fine Pitch Au—SnAgCu Joint-in-via Flip-Chip Packaging," IEEE 9th Electronics Packaging Technology Conference, Dec. 10-12, 2007; 7 pages.
Mosberger et al.; "The Effects of Materials and Post-Mold Profiles on Plastic Encapsulated Integrated Circuits;" IEEE/IRPS; Apr. 1994, 8 pages.
Steiner et al.; "Fully Package CMOS Current Monitor Using Leadon-Chip Technology," Physical Electronics Laboratory, ETHZurich, CH8093 Zurich, Switzerland; No. 0-7803-4412-X/98; IEEE 1998; 6 pages.
Park et al.; "Ferrite-Based Integrated Planar Inductors and Transformers Fabricated at Low Temperature;" IEEE Transactions on Magnetics; vol. 33, No. 5; Sep. 1997; 3 pages.
Request for Continued Examination filed May 26, 2015; for U.S. Appl. No. 14/090,037; 1 page.
Response to Final Office Action filed May 26, 2015; to Final Office Action dated Feb. 24, 2015; for U.S. Appl. No. 14/090,037; 12 pages.
U.S. Appl. No. 14/090,037 Office Action dated Jun. 4, 2015, 5 pages.
Office Action with English translation dated Jul. 30, 2015 for Japanese Application No. 2014-219004; 7 pages.
Office Action with English translation dated Jul. 30, 2015 for Japanese Application No. 2014-219011; 10 pages.
Restriction Requirement dated Aug. 24, 2015 for U.S. Appl. No. 13/748,999; 13 pages.
Final Office Action dated Aug. 28, 2015 for U.S. Appl. No. 13/871,131; 20 pages.
Office Action with English translation dated Sep. 1, 2015 for Japanese Application No. 2011-539582, 4 pages.
Response to Office Action filed Sep. 3, 2015 for U.S. Appl. No. 14/090,037; 13 pages.
Request for Continued Examination, Response to Office Action, IDS filed Sep. 17, 2015 for U.S. Appl. No. 13/838,131; 17 pages.
Letter from Yuasa and Hara dated Nov. 9, 2015, Response to Office Action with English Claims dated Oct. 7, 2015 for Japanese Pat. App. No. 2011-539582; 11 pages.
Letter from Yuasa and Hara dated Nov. 9, 2015, Response with English Claims dated Oct. 29 for Japanese Pat. App. No. 2014-219004; 11 pages.
Letter from Yuasa and Hara dated Nov. 9, 2015, Response with English Claims dated Oct. 29, 2015 for Japanese Pat. App. No. 2014-219011; 10 pages.
Letter from Yuasa and Hara dated Nov. 10, 2015, Notice of Allowance with English Allowed Claims dated Nov. 4, 2015; for Japanese Pat. App. No. 2011-539582; 9 pages.
Request for Continued Examination, Response to Office Action, IDS filed Oct. 8, 2015 for U.S. Appl. No. 13/871,131; 25 pages.
Final Office Action dated Nov. 5, 2015 for U.S. Appl. No. 13/424,618; 24 pages.
International Preliminary Report on Patentability dated Nov. 5, 2015 for PCT Application No. PCT/US2014/032125; 15 pages.
Office Action dated Nov. 19, 2015 for U.S. Appl. No. 13/871,131; 19 pages.
Decision of Refusal with English translation dated Nov. 18, 2015 for Japanese Application No. 2014-219011; 4 pages.
Response to Restriction Requirement and Preliminary Amendment filed Nov. 24, 2015 for U.S. Appl. No. 13/748,999; 14 pages.
Office Action with English translation dated Nov. 19, 2015 for Japanese Application No. 2014-219004; 4 pages.
Office Action dated Dec. 2, 2015 for U.S. Appl. No. 13/838,131; 15 pages.
Request for Continued Examination, Response to Office Action, IDS filed Dec. 1, 2015 for U.S. Appl. No. 13/788,210; 19 pages.

(56) References Cited

OTHER PUBLICATIONS

Notice of Allowance dated Nov. 20, 2015 for U.S. Appl. No. 14/090,037;7 pages.
Japanese Office Action with English translation dated Jan. 27, 2016 for Japanese Patent Application No. 2015-501676; 8 pages.
Response to Office Action dated Mar. 2, 2016 for U.S. Appl. No. 13/788,210; 10 pages.
Response to Office Action dated Mar. 2, 2016 for U.S. Appl. No. 13/838,131; 12 pages.
U.S. Appl. No. 15/049,732, filed Feb. 22, 2016, Milano et al.
Office Action dated Jan. 6, 2016 for U.S. Appl. No. 13/788,210; 15 pages.
Office Action dated Mar. 11, 2016 for U.S. Appl. No. 13/748,999, 35 pages.
Office Action dated Dec. 6, 2000 for U.S. Appl. No. 09/264,254; 12 pages.
Response to Office Action filed Feb. 27, 2001 for U.S. Appl. No. 09/264,254; 11 pages.
Supplemental Amendment filed Mar. 15, 2001 for U.S. Appl. No. 09/264,254; 4 pages.
Preliminary Amendment filed Apr. 19, 2001 for U.S. Appl. No. 09/837,991; 8 pages.
Office Action dated Dec. 19, 2002 for U.S. Appl. No. 09/837,991; 10 pages.
Response to Office Action filed Mar. 4, 2002 for U.S. Appl. No. 09/837,991; 14 pages.
Office Action dated May 14, 2003 for U.S. Appl. No. 09/837,991; 10 pages.
Amendment Under 37 C.F.R §1.116 dated Sep. 4, 2003 for U.S. Appl. No. 09/837,991; 13 pages.
Request for Continued Examination, Response to Office Action filed Feb. 2, 2016 for U.S. Appl. No. 13/424,618, 16 pages.
Response to Office Action filed on Feb. 5, 2016 for U.S. Appl. No. 13/871,131, 19 pages.
Letter from Yuasa and Hara dated Feb. 8, 2016; For Japanese Pat. No. 2011-539582; 2 pages.
Response to Office Action filed May 1, 2015 for European Application No. 13710112.7; 18 pages.
Office Action dated May 7, 2015 for U.S. Appl. No. 13/424,618; 29 pages.
Response to Office Action filed May 11, 2015 for European Application No. 13712040.8; 21 pages.
QPIDS with RCE and IDS filed Apr. 21, 2015 for U.S. Appl. No. 13/871,131;8 page.
Notice of Allowability dated May 21, 2015 for U.S. Appl. No. 13/871,131; 7 pages.
RCE and IDS filed May 22, 2015 for U.S. Appl. No. 13/871,131;7 pages.
Office Action dated Aug. 12, 2015 for U.S. Appl. No. 13/788,210; 17 pages.
Chinese Office Action dated Jan. 29, 2016 with English translation for Chinese Application No. 201380014780.9; 17 pages.
Final Office Action dated Apr. 7, 2016 for U.S. Appl. No. 13/871,131; 9 pages.
Terminal Disclaimer filed Apr. 11, 2016 for U.S. Appl. No. 13/871,131; 2 pages.
Response to Final Office Action filed Apr. 12, 2016 for U.S. Appl. No. 13/871,131; 13 pages.
Letter to Yuasa and Hara dated Mar. 15, 2016 for Japanese Application No. 2015-501676; 2 pages.
German Office Action (with English Translation) dated Mar. 3, 2016 corresponding to German Patent Application No. 112008000759.4; 10 Pages.
Final Office Action dated Apr. 22, 2016; For U.S. Appl. No. 13/838,131; 27 pages.
Chinese Office Action and English translation dated Mar. 2, 2016 for Chinese Application No. 201380026117.0; 50 pages.
Office Action dated Apr. 27, 2016 for U.S. Appl. No. 13/788,210, 18 pages.
Office Action dated May 6, 2016 for U.S. Appl. No. 13/424,618, 15 pages.
Notice of Allowance dated May 9, 2016 for U.S. Appl. No. 13/871,131, 9 pages.
Response to Witten Opinion dated Jun. 10, 2016 for European Application No. 14717654.9, 20 pages.
Response dated Jun. 20, 2016 to Final Office Action dated Apr. 22, 2016; For U.S. Appl. No. 13/838,131; 13 pages.
Request for Continued Examination (RCE), Letter Requesting Non-Entry of Previously Filed Amendment, and Response to Final Office Action dated Apr. 22, 2016 corresponding to U.S. Appl. No. 13/838,131; Response filed on Aug. 16, 2016; 17 Pages.
Applicant-Initiated Interview Summary dated Jul. 27, 2016 for U.S. Appl. No. 13/424,618; 5 pages.
Amendment filed on Aug. 11, 2016 for U.S. Appl. No. 13/748,999; 16 pages.
Request for Continued Examination and Amendment filed on Aug. 24, 2016 for U.S. Appl. No. 13/788,210; 15 pages.
Chinese Response to Office Action with English claims filed Aug. 9, 2016 for Chinese Application No. 201380014780.9; 15 pages.
Japanese Office Action with English Translation and claims dated Jul. 25, 2016 for Japanese Application No. 2015-501720; 13 pages.
European Office Action dated Aug. 10, 2016 for European Application No. 14717654.9; 20 pages.
Koninklijke Philips Electronics Product data sheet KMA200 "Programmable angle sensor" Aug. 16, 2005, 31 pages.
European Office Action dated Aug. 10, 2016 for European Application No. 13710112.7; 29 pages.
Amendment filed on Sep. 1, 2016 for U.S. Appl. No. 13/424,618; 15 pages.
Response to Office Action; dated Jan. 18, 2013; for U.S. Appl. No. 12/360,889; 6 pages.
Office Action dated Jun. 28, 2013; for U.S. Appl. No. 12/360,889; 7 pages.
Notice of Allowance; dated Mar. 1, 2013; for U.S. Appl. No. 12/328,798; 10 pages.
Supplemental Notice of Allowability; dated May 10, 2013; for U.S. Appl. No. 12/328,798; 5 pages.
Notice of Allowance; dated Feb. 21, 2013; for U.S. Appl. No. 13/241,380; 9 pages.
Supplemental Notice of Allowability; dated May 1, 2013; for U.S. Appl. No. 13/241,380; 5 pages.
PCT Invitation to Pay Additional Fees and Partial Search Report of the ISA; dated Jul. 8, 2013; for PCT Pat. App. No. PCT/US2013/025858; 6 pages.
PCT Invitation to Pay Additional Fees and Partial Search Report of the ISA; dated Jul. 1, 2013; for PCT Pat. App. No. PCT/US2013/030112; 7 pages.
U.S. Appl. No. 13/838,131, filed Mar. 15, 2013, Ararao et al.
U.S. Appl. No. 13/838,864, filed Mar. 15, 2013, Ararao et al.
Notice of Allowance dated Nov. 20, 2015; For U.S. Appl. No. 14/090,037; 7 pages.
Office Action dated Mar. 10, 2015 for U.S. Appl. No. 13/788,210; 12 pages.
Response to Office Action dated Jan. 28, 2014 as filed on May 28, 2014 for U.S. Appl. No. 13/838,864.
Response to Office Action dated Jan. 9, 2014 as filed on May 28, 2014 for U.S. Appl. No. 13/838,131.
Japanese Notice of Reasons for Rejection (English translation); dated Jul. 16, 2013; for Japanese Pat. App. No. 2011-539582; 3 pages.

\* cited by examiner

INTEGRATED CIRCUIT PACKAGE HAVING A SPLIT LEAD FRAME

CROSS REFERENCE TO RELATED APPLICATIONS

This application is a Continuation-in-Part application and claims the benefit of U.S. patent application Ser. No. 13/748,999, filed on Jan. 24, 2013, which is a Continuation-in-Part application and claims the benefit of U.S. patent application Ser. No. 13/424,618, filed on Mar. 20, 2012, both of which are incorporated herein by reference in their entirety.

STATEMENT REGARDING FEDERALLY SPONSORED RESEARCH

Not Applicable.

FIELD OF THE INVENTION

This invention relates generally to integrated circuit packaging and, more particularly, to an integrated circuit package having a split lead frame.

BACKGROUND OF THE INVENTION

Techniques for semiconductor packaging are well known in the art. In general, a semiconductor die is cut from a wafer, processed, and attached to a die attach pad of a lead frame. The subassembly may then be overmolded with a plastic or other insulative and protective material to form an integrated circuit (IC) package.

After packaging, the IC may then be placed on a circuit board with other components, including passive components such as capacitors, resistors, and inductors, which can be used for filtering and other functionality. For example, in the case of a magnetic field sensor integrated circuit containing a magnetic field sensing element, components such as capacitors are often required to reduce noise and enhance EMC (electromagnetic compatibility).

Magnetic field sensors including a magnetic field sensing element, or transducer, such as a Hall Effect element or a magnetoresistive element, are used in a variety of applications to detect aspects of movement of a ferromagnetic article, or target, such as proximity, speed, and direction. Illustrative applications include, but are not limited to, a magnetic switch or "proximity detector" that senses the proximity of a ferromagnetic article, a proximity detector that senses passing ferromagnetic articles (for example, magnetic domains of a ring magnet or gear teeth), a magnetic field sensor that senses a magnetic field density of a magnetic field, and a current sensor that senses a magnetic field generated by a current flowing in a current conductor. Magnetic field sensors are widely used in automobile control systems, for example, to detect ignition timing from a position of an engine crankshaft and/or camshaft, and to detect a position and/or rotation of an automobile wheel for anti-lock braking systems.

In applications in which the ferromagnetic target is magnetic or of a hard ferromagnetic material, a magnetically permeable concentrator or magnetic flux guide is sometimes used to focus the magnetic field generated by the target on the magnetic field transducer, thus increasing the sensitivity of the sensor, allowing the use of a smaller magnetic target, and/or allowing the magnetic target to be sensed from a larger distance (i.e., a larger airgap). In other applications, in which the ferromagnetic target is not magnetic, a permanent magnet, sometimes referred to as a back bias magnet, may be used to generate the magnetic field that is then altered by movement of the target.

In some applications it is desirable to provide a back bias magnet with two magnetic poles on the magnet surface adjacent to the magnetic field transducer. For example, as described in a U.S. Pat. No. 5,781,005 entitled "Hall-Effect Ferromagnetic-Article-Proximity Sensor," which is assigned to the Assignee of the subject application, the near presence of opposite poles serves to short out the lines of flux when no ferromagnetic article is present, thereby presenting a significant and easily recognizable difference between an article present (e.g., gear tooth present) condition and an article absent (e.g., gear valley present) condition and maintaining a low magnetic flux density baseline regardless of airgap. Because of the easily recognizable difference in the magnetic field signal, these types of arrangements are advantageous for use in sensors in which it is necessary to detect the presence/absence of a magnetic article, such sensors sometimes being referred to as True Power On Sensors, or TPOS, sensors.

Generally, back bias magnets and concentrators are held in place relative to the magnetic field sensing element by mechanical means, such as an adhesive as shown in a U.S. Pat. No. 6,265,865 entitled "Single Unitary Plastic Package for a Magnetic Field Sensing Device," which is assigned to the Assignee of the subject application. Such mechanical positioning can lead to performance variations, such as sensitivity variations, from device to device due to position tolerances. Thus, it may be advantageous to manufacture the sensor so that the sensor and the back bias magnet or concentrator are integrally formed, thereby eliminating position tolerances. A magnetic field sensor of this type is described in a U.S. Patent Application Publication No. 2010/0141249 entitled "Magnetic Field Sensors and Methods for Fabricating the Magnetic Field Sensors," which is also assigned to the Assignee of the subject application and in which a concentrator or magnet may be formed by a liquid encapsulant or a combination of a liquid encapsulant and permanent magnet in a cavity on the side of the sensor opposite the target.

While the use of a back bias magnet is advantageous in certain applications, the hard magnetic material used to form the magnet is relatively expensive and represents a significant part of the overall cost of the sensor.

There are many package types and fabrication techniques in use for providing integrated circuit magnetic field sensors. For example, the semiconductor die in which the magnetic field sensing element is formed may be attached to a lead frame by various techniques, such as with an adhesive tape or epoxy, and may be electrically coupled to the lead frame by various techniques, such as with solder bumps or wire bonding. Also, the lead frame may take various forms and the semiconductor die may be attached to the lead frame in an orientation with the active semiconductor surface (i.e., the surface in which the magnetic field sensing element is formed) being adjacent to the lead frame in a so called "flip-chip" arrangement, with the active semiconductor surface opposite the lead frame surface in a so called "die up" arrangement, or with the semiconductor die positioned below the lead frame in a so called "Lead on Chip" arrangement.

Molding is often used in fabricating integrated circuit magnetic field sensors to provide the protective and electrically insulative overmold to the semiconductor die. Transfer molding has also been used to form two different molded portions for various reasons. For example, in a U.S. Pat. No.

7,816,772 entitled "Methods and Apparatus for Multi-Stage Molding of Integrated Circuit Package" which is assigned to the Assignee of the subject application, a first molded structure is formed over the semiconductor die to protect wire bonds and the device is overmolded with a second molded structure formed over the first molded structure. In a U.S. Patent Application Publication No. 2009/0140725 entitled "Integrated Circuit Including Sensor having Injection Molded Magnetic Material," an injection molded magnetic material encloses at least a portion of a magnetic field sensor.

Molding, while providing a cost effective fabrication technique, can present challenges, such as removal of the device from the mold in a manner that does not subject the device to deleterious stresses.

SUMMARY OF THE INVENTION

A magnetic field sensor includes a lead frame having a plurality of leads, at least two of which have a connection portion and a die attach portion and a semiconductor die attached to the die attach portion of the at least two leads. A non-conductive mold material may enclose the semiconductor die and the die portion of the at least two leads.

A wire bond or other electrical connection mechanism may be used to electrically connect the semiconductor die to the die attach portion of at least one of the leads. In some embodiments, a wire bond is coupled between the semiconductor die and a location of a lead die attach portion distal from the respective connection portion of the lead. Alternatively or additionally, a wire bond may be coupled between the semiconductor die and a location of the lead die attach portion proximal to the respective connection portion of the lead.

A passive component may be coupled to at least two of the plurality of leads. In some embodiments, the passive component is coupled to the die attach portion of at least two leads. One or more passive components may additionally or alternatively be coupled to the connection portion of at least two leads. In one illustrative example, the passive component is a capacitor, but other types of passive components, such as resistors, inductors, and diodes as examples, are possible.

According to a further aspect, at least one lead has a first portion that is separated from a second portion of the lead and the magnetic field sensor further includes a passive component coupled between the first portion and second portion of the lead. With this arrangement, the passive component is electrically coupled in series or "in-line" with the respective lead. In one illustrative example, the passive component is a resistor, but other types of passive components, such as capacitors, inductors, and diodes as examples, are possible.

Additional described features include one or more slots in the die attach portion of at least one of the plurality of leads, one or more widened portions of the connection portion of at least one of the plurality of leads, and a ferromagnetic mold material secured to a connection portion of at least one of the leads.

According to a further aspect, a ferromagnetic mold material may be secured to a portion of the non-conductive mold material. The ferromagnetic mold material may comprise a soft or hard ferromagnetic material as examples and may function in the manner of a concentrator or back bias magnetic, respectively.

BRIEF DESCRIPTION OF THE DRAWINGS

The foregoing features of the invention, as well as the invention itself may be more fully understood from the following detailed description of the drawings, in which.

DETAILED DESCRIPTION OF THE INVENTION

Figure 1:
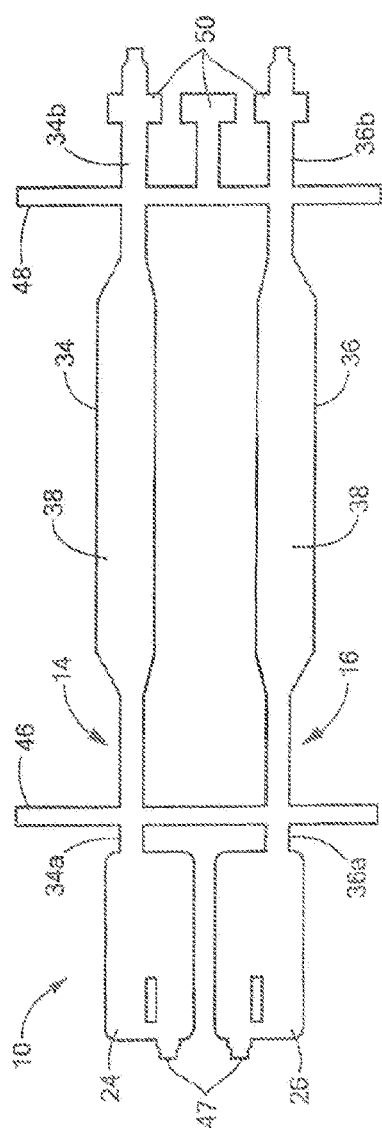
FIG. 1 is a plan view of a split lead frame.
Figure 2:
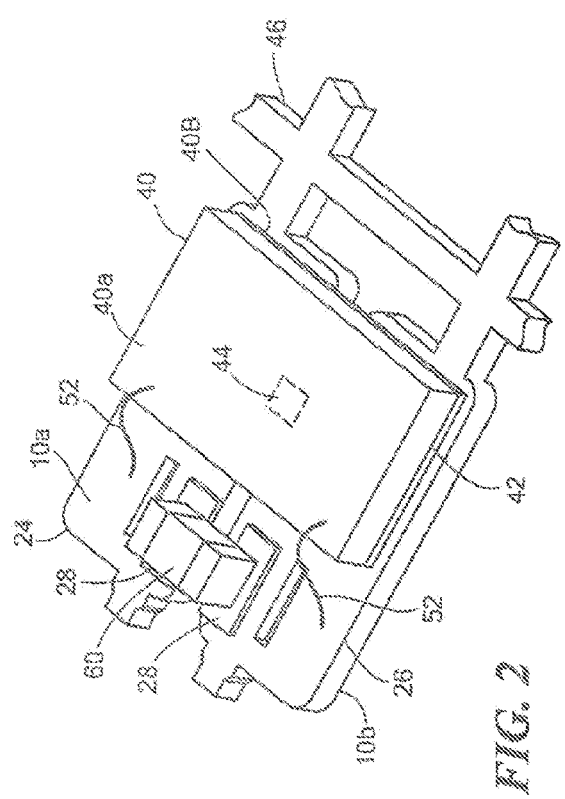
FIG. 2 is a perspective view of a magnetic field sensor integrated circuit containing the split lead frame of FIG. 1 during fabrication.

Referring to FIG. 1 a lead frame 10 for use in an integrated circuit includes a plurality of leads 14, 16, at least two of which (and here, the two illustrated leads comprising the plurality of leads) include a respective die attach portion 24, 26 and connection portion 34, 36. The lead frame 10 has a first surface 10a and a second, opposing surface 10b (FIG. 2). As will be explained, the die attach portion 24, 26 of the leads (referred to herein sometimes as simply the die portion) can have a semiconductor die (FIG. 2) attached thereto.

The connection portion 34, 36 of the leads extends from a first end 34a, 36a proximate to the respective die portion 24, 26 to a second, distal end 34b, 36b distal from the die portion. Generally, the connection portion 34, 36 of the leads is elongated and is suitable for making electrical connection to electronic systems and components (not shown) outside of the integrated circuit package, such as a power source or microcontroller. For example, in the case of a through hole connection to a printed circuit board, the distal end 34b, 36b of the connection portions is provided in form of a pin suitable for a solder connection to a circuit board through hole. Alternatively, in the case of a surface mount connection, the distal end 34b, 36b of the connection portions will include a surface mount pad. Another embodiment may include a wire soldered or otherwise connected to the connection portions 34, 36.

The lead frame 10 has tie bars 46, 47, 48 that are provided to hold the leads 14, 16 together during manufacture. A first tie bar 46 is positioned near the die portion 24, 26 of the leads and the first end 34a, 36a of the connection portions and a second tie bar 48 is positioned near the distal end 34b, 36b of the connection portions 34, 36, as shown. Another tie bar portion is shown at 47 at the opposite side of the die portion 24, 26 from the lead ends 34a, 34b. In addition to facilitating manufacture, the tie bar(s) can also serve to protect the leads during handling, for example, by maintaining coplanarity of the elongated connection portions 34, 36.

An additional feature of the lead frame 10 includes extended regions 50 that extend beyond the distal ends 34b, 36b of the lead connection portions, as shown. These regions 50 may be molded with plastic to help maintain lead co-planarity with electrical isolation.

The connection portion 34, 36 of the leads 14, 16 may have widened regions 38 in order to further facilitate handling of the integrated circuit during assembly and improve the strength of the leads. The illustrative widened regions 38 extend slightly outward along a portion of the length of the connection portions in a direction away from the adjacent lead as shown, in order to maintain a desired spacing between the leads. It will be appreciated that the widened regions may have various shapes and dimensions to facilitate IC integrity during handling and assembly, or be eliminated in other embodiments, and may extend in a direction toward the adjacent lead(s) as long as the desired spacing between leads is achieved.

The lead frame 10 may be formed from various conventional materials and by various conventional techniques, such as stamping or etching. As one example, the lead frame 10 is a NiPdAu pre-plated lead frame. Other suitable materials for the lead frame include but are not limited to aluminum, copper, copper alloys, titanium, tungsten, chromium, KOVAR™ ferrous alloy, nickel, or alloys of the metals. Furthermore, the lead and lead frame dimensions can be readily varied to suit particular application requirements. In one illustrative example, the leads 14, 16 have a thickness on the order of 0.25 mm and the connection portions 34, 36 are on the order of 10 mm long. Typically, the lead frame 10 which will be used to form a single integrated circuit, is formed (e.g., stamped) with a plurality of other identical or similar lead frames in a single stamping process for example, and the lead frames 10 separated during manufacture for formation of individual integrated circuits.

Referring also to FIG. 2, at a later stage of manufacture, a semiconductor die 40 can be attached to the lead frame 10. Thus, the lead frame 10 does not have a conventional contiguous die attach pad or area to which the die is attached, but rather the die is attached to die portions 24, 26 of at least two leads 14, 16 and thus to a non-contiguous surface. Accordingly, the lead frame 10 can be referred to as a "split lead frame" since there is not a contiguous die attach surface. The semiconductor die 40 has a first surface 40a in which a magnetic field sensing element 44 is disposed and a second, opposing surface 40b. The die 40 may be attached to the die attach portion 24, 26 of the leads such that the opposing die surface 40b is adjacent to the die attach portions 24, 26, in a die up arrangement. Alternatively, the semiconductor die 40 may be attached to the die attach portion 24, 26 of the leads such that the first, active die surface 40a is adjacent to the die attach portions 24, 26, in a flip-chip arrangement.

Various techniques and materials can be used to attach the die 40 to the die attach portions 24, 26. Since the die 40 is attached across multiple leads 14, 16, the mechanism 42 for attaching the die to the lead frame 10 must be a non-conductive adhesive 42, such as a non-conductive epoxy or tape, such as a KAPTON® tape polyimide film, or die attach film.

In addition to the magnetic field sensing element 44, the die 40 supports other electronic components and circuitry, and the sensing element 44 and other electronic components supported by the die can be coupled to the leads 14, 16 by various techniques, such as by solder balls, solder bumps, pillar bumps, or the illustrated wire bonds 52. If solder balls, solder bumps, or pillar bumps are used, the die 40 may be attached to the die attach portions 24, 26 with the active die surface 40a adjacent to the lead frame surface 10a, as in a flip-chip arrangement. In the illustrative embodiment of FIG. 2, the wire bonds are coupled between the die 40 and a location of the die attach portions 24, 26 distal from the respective connection portion 34, 36. While the lead frame 10 is shown to include two leads 14, 16, it will be appreciated by those of ordinary skill in the art that various numbers of leads, such as between two and eight, are possible.

While the illustrated die 40 is used to form a magnetic field sensor and thus, supports at least one magnetic field sensing element 44, it will be appreciated by those of ordinary skill in the art that the integrated circuit packaging described herein can be used in connection with other types of integrated circuits. As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

The integrated circuit shown during manufacture in FIG. 2 includes at least one integrated passive component 60, such as a resistor, inductor, capacitor, or diode, and here includes a capacitor 60 attached to the lead frame 10. More particularly, the capacitor 60 is coupled across the die attach portion 24, 26 of respective leads 14, 16. The capacitor 60 may be useful to reduce EMC, ESD or address other electrical issues with the resulting sensor. For example, with capacitor 60, power to the sensor may be held longer in order to prevent a power on reset state by holding an output state in the case of a broken or damaged wire. It is possible to have other types of passive components coupled between leads and other numbers of capacitors, for example one capacitor may be provided between a power and ground or output and ground pins.

Various techniques and material are suitable for attaching the passive component 60 to the leads 14, 16. As one example, the capacitor is a surface mount capacitor and the die attach portions 24, 26 include respective surface mount pads, plated areas, or solder paste regions 28 to which the capacitor is attached, as shown. In general, the passive component 60 can be attached to the die attach portions 24, 26 by soldering or with a conductive adhesive, such as a conductive epoxy.

In some embodiments, the leads may have a cutout, depressed, or recessed region in which a passive component, such as capacitor 60, can be positioned below the surface 10a of the lead frame on which the die 40 is positioned. With such an arrangement, the "active area depth" of the sensor and the entire package thickness is advantageously reduced as compared to a package having a capacitor mounted on the lead frame surface 10a. In another embodiment the passive component 60 may be attached to the other side of the lead frame on surface 10b. Such an arrangement may allow further reduction of the active area depth by reducing the thickness of the mold material above the die. In other embodiments, a passive component may be attached to the opposing surface 10b of the lead frame 10. Additional aspects of integrated passive components are described in a U.S. Patent Application Publication No. US-2008-0013298-A1, entitled "Methods and Apparatus for Passive Attachment of Components for Integrated Circuits," which is assigned to the Assignee of the subject application.

Figure 3:
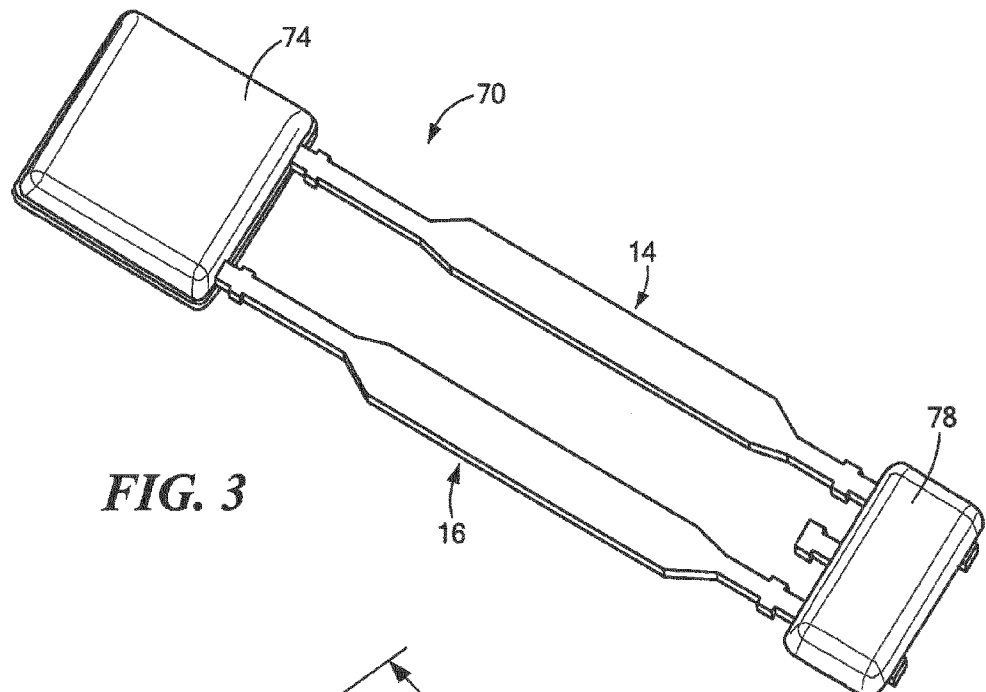
FIG. 3 is a perspective view of the packaged magnetic field sensor integrated circuit of FIG. 2.

Referring also to FIG. 3, a packaged integrated circuit magnetic field sensor 70 containing the lead frame 10 with leads 14, 16 and the subassembly of FIG. 2 is shown after overmolding. During overmolding, a non-conductive mold material 74 is provided to enclose the semiconductor die 40 and a portion of the leads 14, 16 including the die attach portions 24, 26.

The molded enclosure comprising a non-conductive mold material 74 may be formed by various techniques, including but not limited to injection molding, compression molding, transfer molding, and/or potting, from various non-conductive mold materials, such as Sumitomo FGT700. In general, the non-conductive mold material 74 is comprised of a non-conductive material so as to electrically isolate and mechanically protect the die 40 and the enclosed portion of the lead frame 10. Suitable materials for the non-conductive mold material 74 include thermoset and thermoplastic mold compounds and other commercially available IC mold compounds. It will be appreciated that the non-conductive mold material 74, while typically non-ferromagnetic, can contain a ferromagnetic material, such as in the form of ferromagnetic particles, as long as such material is sufficiently non-conductive.

A non-conductive mold material 78 is provided to enclose a distal end of the lead frame 10, beyond the extended regions 50 and the connection portion ends 34b, 36b, in order to provide a carrier that can be used to hold the integrated circuit 70 during handling and assembly and also to help maintain coplanarity of the leads. It will be appreciated by those of ordinary skill in the art that the second enclosure 78 may be removed prior to connecting the integrated circuit 70 to a printed circuit board for example. The tie bars 46, 48 are removed during manufacture in a process sometimes referred to as "singulation" in order to prevent shorting of the leads and to thereby provide the packaged magnetic field sensor integrated circuit 70 shown in FIG. 3.

Figure 4:
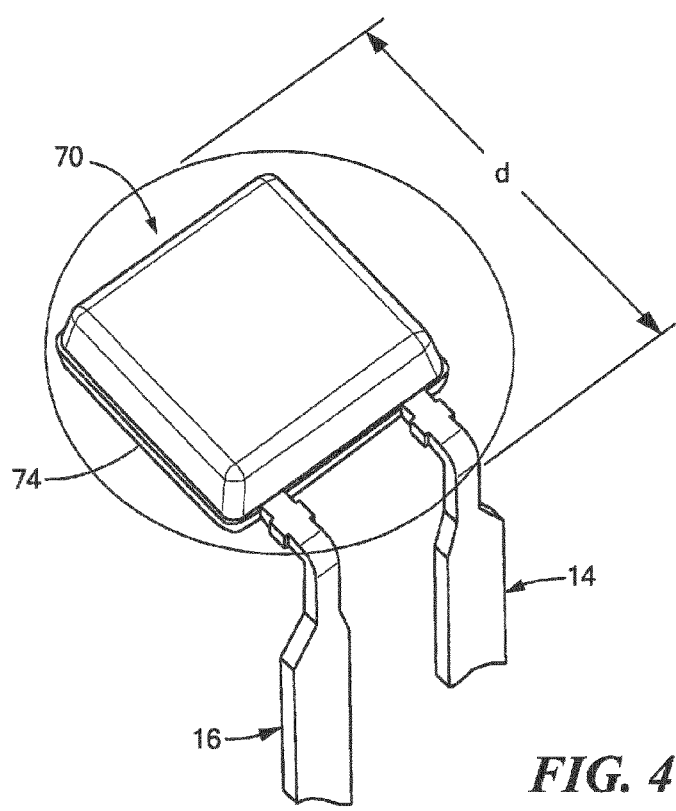
FIG. 4 is a perspective view of the packaged magnetic field sensor integrated circuit of FIG. 3 with leads bent for assembly.

Referring also to FIG. 4, the leads 14, 16 may be bent as shown, depending on the orientation of the system (e.g., circuit board) to which the IC 70 is being connected and the desired orientation of the magnetic field sensing element 44 relative to external targets being sensed. Notably, the diameter "d" (as defined by a circle enclosing the non-conductive mold material 74) is small, such as on the order of 6.0 mm to 6.5 mm in one illustrative embodiment and more generally between approximately 5.0 mm and 7.0 mm. This small volume/diameter package is attributable at least in part to the split lead frame design. In other words, because the die 40 is attached across die attach portions 24, 26 of multiple leads, a contiguous, generally larger area dedicated for attachment of the die is not required. The described package system includes one or more passive components, such as capacitor 60, which may form a passive network to reduce the overall size of a sensor system when compared to a package that requires an external attachment of the passive network that typically would occur on a PC board.

Figure 5:
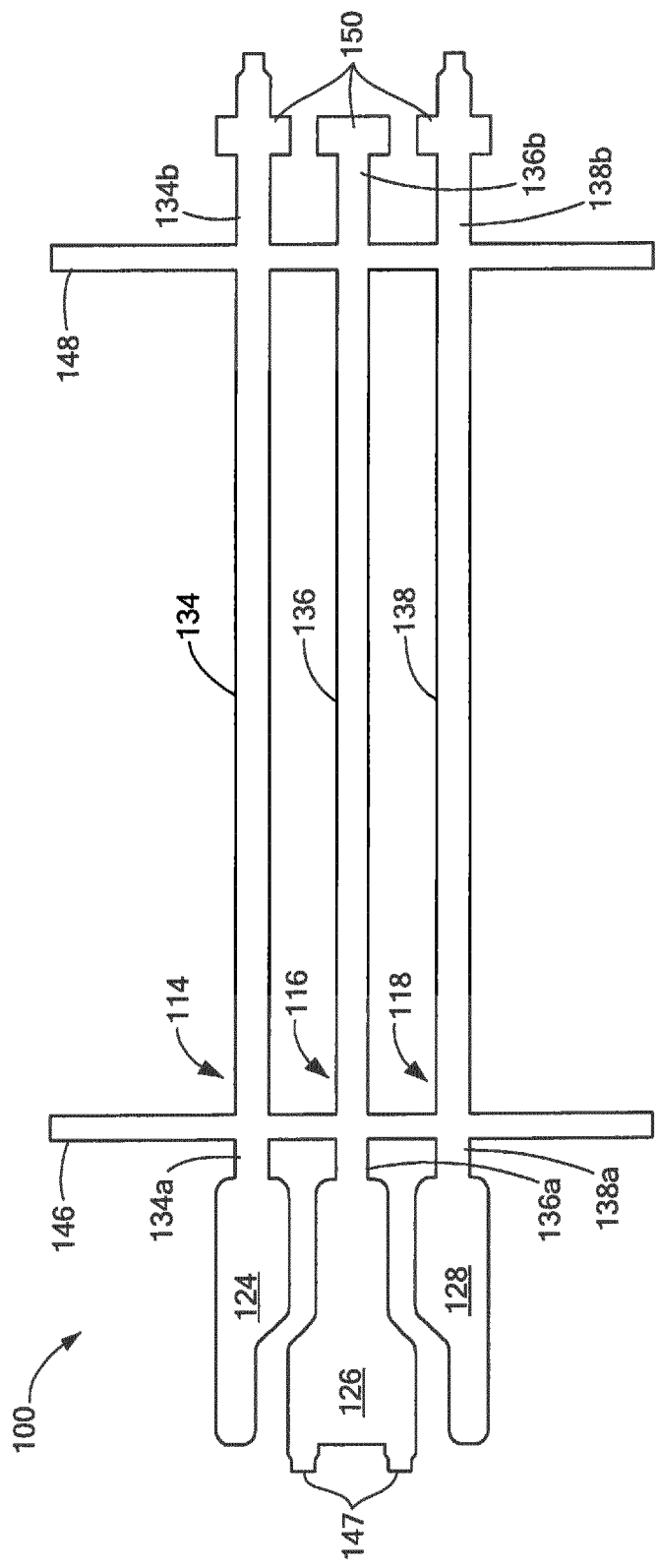
FIG. 5 is a plan view of an alternative split lead frame.
Figure 6:
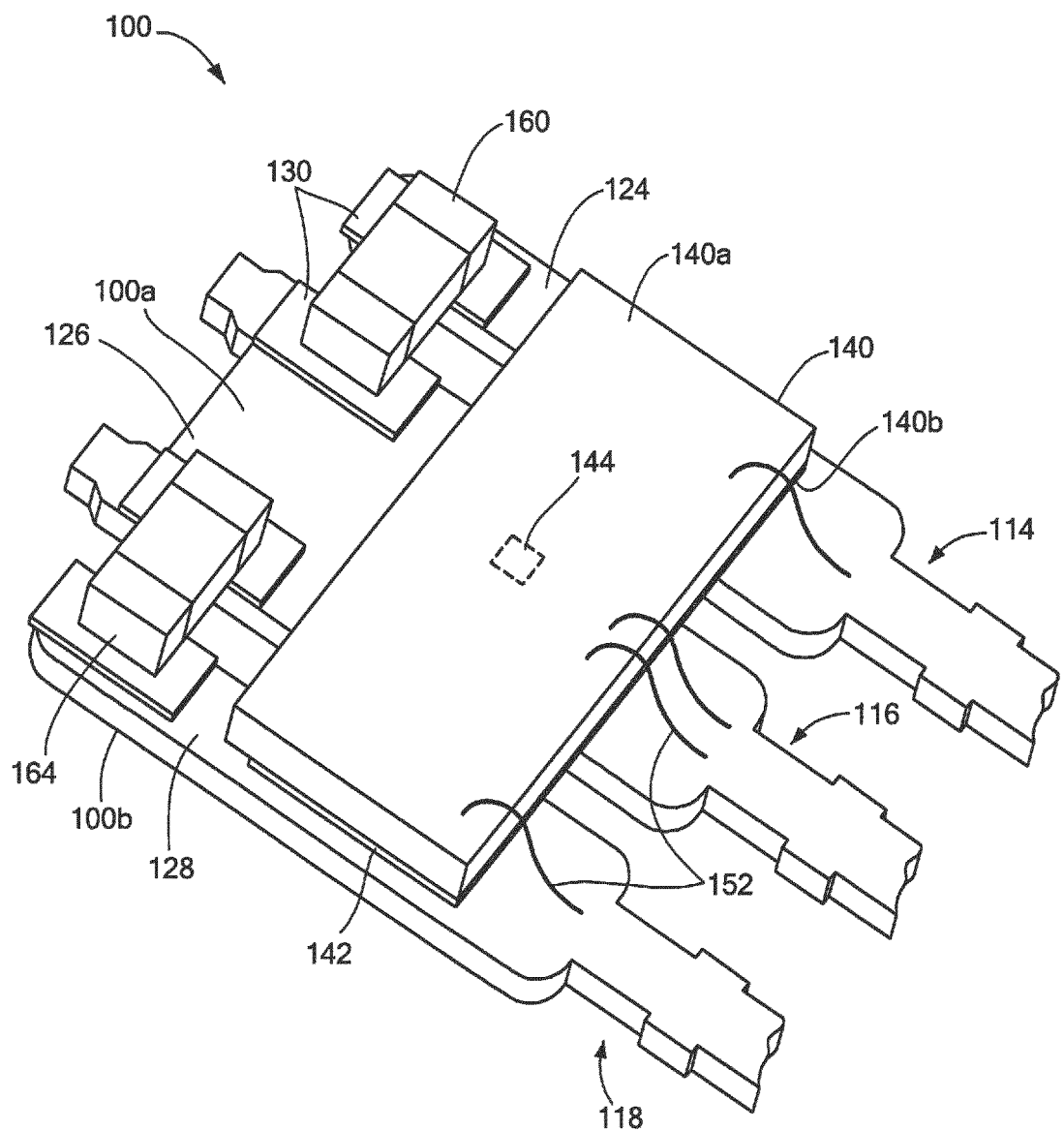
FIG. 6 is a perspective view of a magnetic field sensor integrated circuit containing the split lead frame of FIG. 5 during fabrication.

Referring also to FIG. 5, an alternative lead frame 100 for use in an integrated circuit includes a plurality of leads 114, 116, and 118, at least two of which (and here, all three of which) include a respective die attach portion 124, 126, 128 and a connection portion 134, 136, 138. The lead frame 100 has a first surface 100a and a second, opposing surface 100b (FIG. 6). As will be explained, the die attach portion 124, 126, 128 of the leads can have a semiconductor die (FIG. 6) attached thereto.

The connection portion 134, 136, 138 of the leads can be the same as or similar to the connection portion 34, 36 of the leads 14, 16 of FIG. 1 and extends from a first end 134a, 136a, 138a proximate to the respective die portion 124, 126, 128 to a second, distal end 134b, 136b, 138b distal from the die portion. Here again, the connection portion 134, 136, 138 of the leads is generally elongated and is suitable for electrical connection to electronic components or systems (not shown) outside of the integrated circuit package, such as by soldering to a printed circuit board. The connection portions may have wider regions as shown by 38 in FIG. 1 in the connection portions 134, 136, and 138.

The lead frame 100 has tie bars 146, 147, 148 that may be the same as or similar to tie bars 46, 48 of FIG. 1 and that are provided to hold the leads 114, 116, 118 together during manufacture. Here again, a first tie bar 146 is positioned near the die attach portion 124, 126, 128 of the leads and the first end 134a, 136a, 138a of the connection portions and a second tie bar 148 is positioned near the distal end 134b, 136b, 138b of the connection portions 134, 136, 138 as shown. A tie bar portion is shown at 147 at the opposite side of the die portion 124, 126, and 128 from the lead ends 134a, 136b, and 138b. Extended regions 150 that are the same as or similar to extended regions 50 of FIG. 1 may be provided.

The lead frame materials and formation techniques may be the same as or similar to the lead frame 10 of FIG. 1. Thus, as one example, the lead frame 100 may be a stamped NiPdAu pre-plated lead frame.

Referring also to the lead frame 100 during a later stage of manufacture as shown in FIG. 6, a semiconductor die 140 having a first surface 140a in which a magnetic field sensing element 144 is disposed and a second, opposing surface 140b can be attached to the lead frame 100 in either a die-up or flip-chip arrangement. Thus, here again the lead frame 100 does not have a conventional contiguous die attach pad or area to which the die is attached, but rather the die is attached to die portions 124, 126, 128 of at least two leads 114, 116, 118, and in the illustrative embodiment of FIG. 6, is attached to the die portions of three leads. The die 140 may be attached to the die portions 124, 126, 128 with a non-conductive adhesive 142, such as an epoxy, tape, or a combination of epoxy and tape as examples.

Wire bonds, such as wire bonds 152 as shown, or other suitable electrical connection mechanisms, such as solder balls, solder bumps, or pillar bumps as examples, can be used to electrically connect the magnetic field sensing element 144 and other electronic components supported by the die 140 to the lead frame 100. If solder balls, solder bumps, or pillar bumps are used, the die 140 may be placed with the die surface 140a adjacent to the surface 110a of the lead frame 110, as in a flip-chip arrangement. In the illustrative embodiment of FIG. 6, the wire bonds 152 are coupled between the die 140 and a location of the die attach portions 124, 126, 128 proximal from the respective connection portion 134, 136, 138. Here again, while the illustrated die 140 supports a magnetic field sensing element 144, it will be appreciated by those of ordinary skill in the art that the integrated circuit packaging described herein can be used in connection with other types of integrated circuits or sensors. Furthermore, while the lead frame 100 is shown to include three leads 114, 116, 118, it will be appreciated by those of ordinary skill in the art that various numbers of leads, such as between two and eight, are possible.

The integrated circuit shown during manufacture in FIG. 6 includes at least one integrated passive component, such as a resistor, inductor, capacitor, or diode, and here includes two capacitors 160, 164 attached to the lead frame 100. More particularly, the capacitor 160 is coupled across leads 114 and 116 and capacitor 164 is coupled across leads 116 and 118. Capacitors 160, 164 may be the same as or similar to capacitor 60 of FIG. 2. In one illustrative example, capacitors 160, 164 are surface mount capacitor that are attached to surface mount pads, solder paste regions, or plated areas 130.

Figure 7:
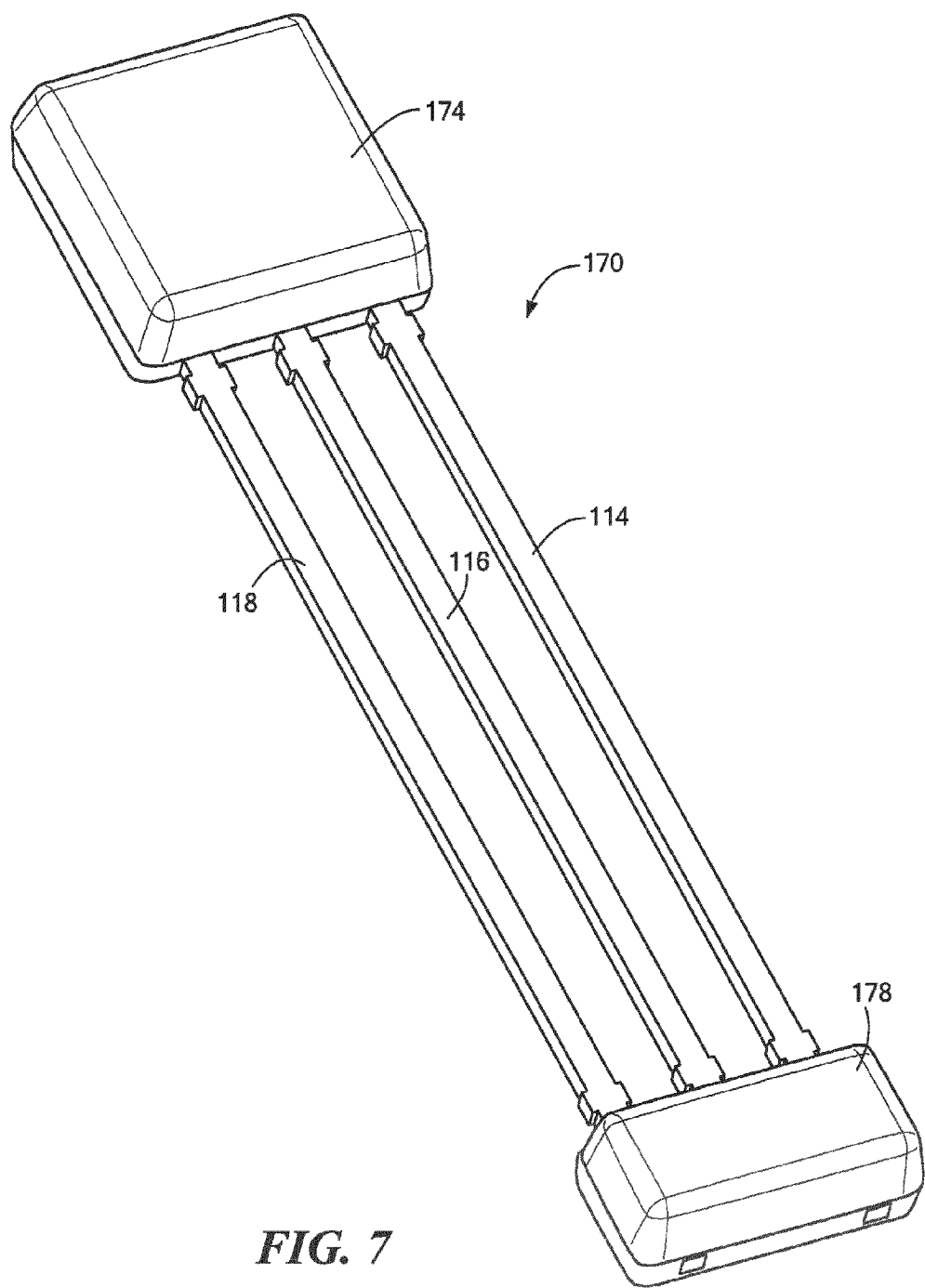
FIG. 7 is a perspective view of the packaged magnetic field sensor integrated circuit of FIG. 6.

Referring also to FIG. 7, a packaged integrated circuit magnetic field sensor 170 containing the lead frame 100 with leads 114, 116, 118 and the subassembly of FIG. 6 is shown after overmolding. During overmolding, a non-conductive mold material 174 that may be the same as or similar to the non-conductive mold material 74 of FIG. 3 is provided to enclose the semiconductor die 140 and a portion of the leads 114, 116, 118 including the die attach portions 124, 126, 128. Here again, the non-conductive mold material 174 may be formed by various techniques such as injection molding, compression molding, transfer molding, and/or potting and from various non-conductive mold materials, such as Sumitomo FGT700.

A non-conductive mold material 178 is provided to enclose a distal end of the lead frame 100, beyond the extended regions 150 and the connection portion ends 134b, 136b, 138b in order to provide a carrier that can be used to hold the integrated circuit during handling and assembly and also to help maintain coplanarity of the leads. It will be appreciated by those of ordinary skill in the art that the second enclosure 178 may be removed prior to connecting the integrated circuit 170 to a printed circuit board for example. The tie bars 146, 148 are removed during manufacture in a process sometimes referred to as "singulation" in order to prevent shorting of the leads and to thereby provide the packaged magnetic field sensor integrated circuit 170 shown in FIG. 7.

While not shown in the view of FIG. 7, it will be appreciated that the leads 114, 116, 118 may be bent for assembly, for example in the manner shown in FIG. 3. The diameter of the molded enclosure 174 is advantageously small as compared to a conventional integrated circuit in which the die is attached to a dedicated, contiguous die attach area, as explained above in connection with FIG. 4. The described package system includes one or more passive components, such as capacitors 160 and 164, which may form a passive network to reduce the overall size of a sensor system when compared to a package that requires an external attachment of the passive network that typically would occur on a PC board which would generally result in a larger diameter of the sensor assembly.

Figure 8:
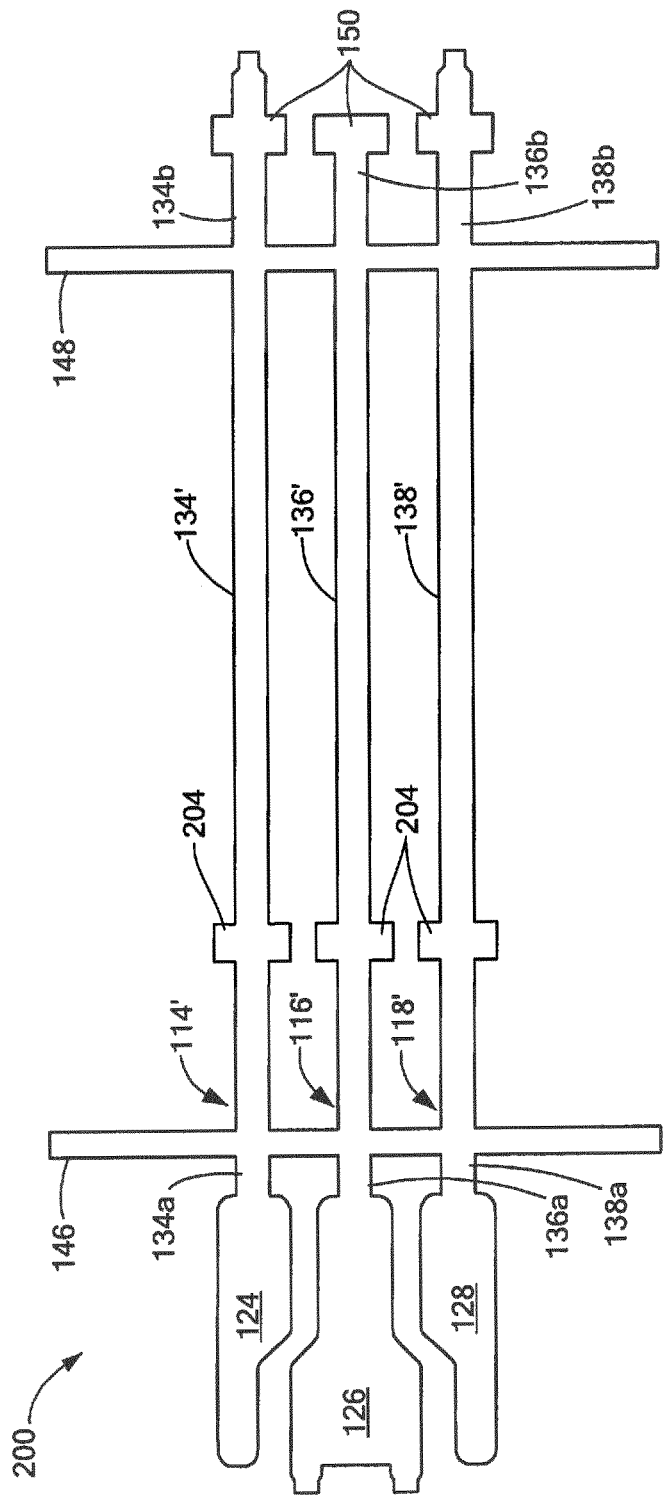
FIG. 8 is a plan view of a further alternative split lead frame.

Referring also to FIG. 8, an alternative lead frame 200 is shown in which like elements of FIG. 5 are labeled with like reference characters. The lead frame 200 differs from the lead frame 100 of FIG. 5 only in the addition of extended regions 204 extending laterally from the leads at a position along the length of the respective lead connection portion 134, 136, 138, as shown. The extended regions 204 facilitate additional features of the integrated circuit sensor; namely, permitting one or more passive components to be coupled between respective pairs of leads and also permitting one or more suppression devices to be provided in order to enhance the electromagnetic compatibility (EMC) of the sensor and to reduce electrostatic discharge (ESD).

Thus, lead frame 200 includes a plurality of leads 114', 116', and 118', at least two of which (and here, all three of which) include a respective die portion 124, 126, 128 and a connection portion 134', 136', 138'. The connection portion 134', 136', 138' extends from a first end 134a, 136a, 138a proximate to the respective die portion 124, 126, 128 to a second, distal end 134b, 136b, 138b distal from the die portion. The connection portion 134, 136, 138 of the leads is generally elongated and suitable for electrical connection to electronic components or systems (not shown) outside of the integrated circuit package, such as by soldering to a printed circuit board, and here includes extended regions 204.

Figure 9:
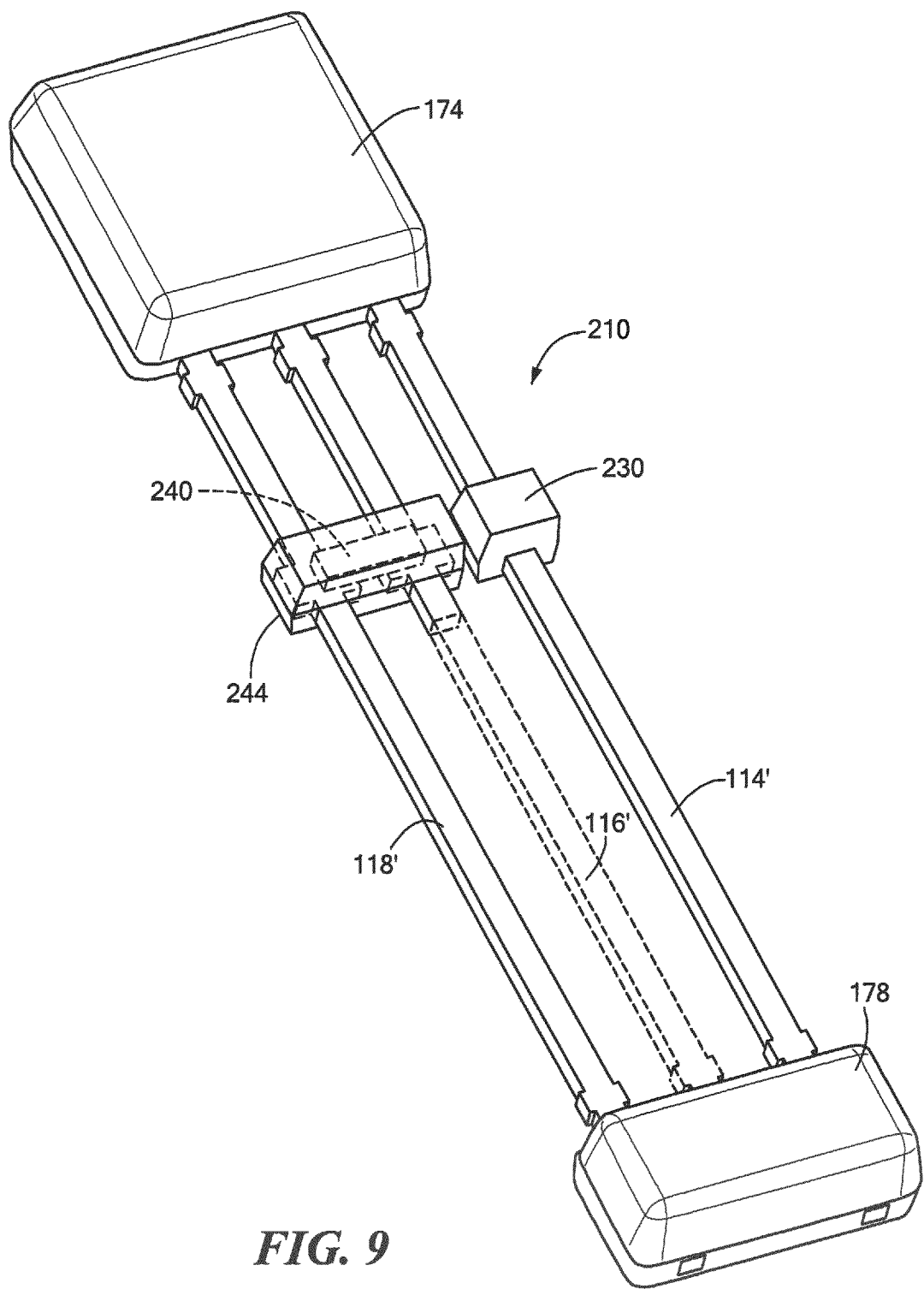
FIG. 9 is a perspective view of a magnetic field sensor integrated circuit containing the split lead frame of FIG. 8 during fabrication.

Referring also to FIG. 9, in which like elements to FIG. 7 are labeled with like reference characters, an integrated circuit magnetic field sensor 210 differs from the sensor of FIG. 7 in that the sensor 210 contains lead frame 200 (FIG. 8). The sensor 210 includes a suppression device 230 is positioned to enclose a portion of one or more leads, here lead 114', at a location of the respective lead spaced from the non-conductive mold material 174. The suppression device 230 is provided in order to enhance the electromagnetic compatibility (EMC) of the sensor and to reduce electrostatic discharge (ESD). The suppression device 230 may be provided in various geometries (i.e., size and shape), and at various locations of the sensor, and may be fabricated by various techniques.

The suppression device 230 is comprised of a soft ferromagnetic material. In some embodiments, it may be desirable for the molded soft ferromagnetic element 230 to have a relatively low coercivity and high permeability. Suitable soft ferromagnetic materials include, but are not limited to permalloy, NiCo alloys, NiFe alloys, steel, nickel, and soft ferromagnetic ferrites. As described above for hard ferromagnetic materials, it may also be desirable to form a soft ferromagnetic suppression device in the presence of a magnetic field for a more anisotropic ferromagnetic material. In another embodiment it may be desirable to form an isotropic soft ferromagnetic suppression body without using a magnetic field applied during molding.

In other embodiments, the suppression device 230 may be formed by a molding process and is shown to enclose an extended portion 204 (FIG. 8). While lead 114' is shown in FIG. 8 to have an extended region 204, it will be appreciated that such extended region may not be necessary in the case of molded suppression device 230. Because of the placement of the suppression device on the leads, the mold material comprising the device must be of sufficient resistivity to prevent unwanted electrical signals from being passed between the leads.

The suppression device 230 comprises a ferromagnetic mold material and may be comprised of a hard or permanent magnetic material. In some embodiments, it may be desirable for the ferromagnetic mold material to have a coercivity larger than its remanence. Illustrative hard magnetic materials for the suppression device 230 include, but are not limited to hard magnetic ferrites, SmCo alloys, NdFeB alloy materials, or PLASTIFORM® bonded magnet materials of Arnold Magnetic Technologies Corp., or other plastic compounds with hard magnetic particles, for example a thermoset polymer such as polyphenylene sulfide material (PPS) or nylon material containing SmCo, NdFeB, or hard ferromagnetic ferrite magnetic particles; or a thermoset polymer such as SUMIKON®EME thermoset polymer of Sumitomo Bakelite Co., Ltd or similar type of thermoset mold material containing hard magnetic particles. In some embodiments it may be desirable to align the hard ferromagnetic particles during molding to form a more anisotropic or directional permanent magnetic material by molding in the presence of a magnetic field; whereas, in other embodiments, a sufficient magnet may result without an alignment step during molding for isotropic materials. It will be appreciated that a NdFeB or a SmCo alloy may contain other elements to improve temperature performance, magnetic coercivity, or other magnetic properties useful to a magnetic design.

The suppression device 230 extends from the connection portion of the lead 114' to surround the lead and thus, extends above and below the connection portion. While the device 230 is shown to extend above and below the lead by the approximately the same distance, it will be appreciated by those of ordinary skill in the art that this need not be the case. Generally, the overall height of the suppression device 230 may be (but is not required to be) less than the overall height of the mold enclosure 174 so as not extend beyond the main package body.

The suppression device may comprise a plurality of individual molded ferromagnetic devices, each enclosing a portion of a respective lead 114', 116' and 118'. Alternatively or additionally, the suppression device may be provided in the form of a shared molded device formed to enclose a portion of more than one lead. In some embodiments, the molded suppression device 230 may include a first mold element in contact with the lead and a second mold element enclosing at least a portion of the first mold element.

According to a further feature, the magnetic field sensor integrated circuit 210 includes a passive component 240. As is known and described in U.S. Patent Application Publication No. US-2012-0086090-A1, it is sometimes desirable to integrate one or more passive components, such as capacitors, resistors, inductors, or diodes on an integrated circuit lead frame for filtering and/or other functionality. The passive component 240, such as a capacitor, may be fabricated by techniques described in the above-referenced U.S. Patent Application Publication No. US-2012-0086090-A1.

The extended regions 204 of the leads 116', 118' to facilitate attachment of the passive component 240 therebetween, such as by soldering. Alternatively, the extended regions 204 may be omitted and the passive component(s) may be coupled directly across respective pairs of leads.

The passive component 240 can be enclosed by a mold material to provide a mold enclosure 244. The mold enclosure 244 can comprise a non-conductive mold material, that can be similar to or the same as the material comprising the mold enclosure 174. Alternatively, the passive component 240 can be enclosed by a ferromagnetic material that may be the same as or similar to the ferromagnetic material comprising suppression device 230 for example in order to thereby provide a further suppression device provided the ferromagnetic material is sufficiently non-conductive.

The mold enclosure 244 is sized and shaped to enclose the passive component 240 and meet other packaging size requirements. It will be appreciated by those of ordinary skill in the art that other variations are possible for providing a passive component across leads and/or for providing a suppression device. For example, a ferromagnetic bead may be enclosed by a molded suppression device 230 comprising a non-ferromagnetic mold material.

In some embodiments in which the lead frame includes more than two leads, it may be desirable to have one or more leads be no connect leads provided for purposes of passive component attachment. For example, in the embodiment of FIG. 9, it may be desirable to have the middle lead 116' be a no connect lead in which case the lead 116' could be trimmed near the enclosure 244 (as shown by the dotted lines of lead 116' in FIG. 9 that illustrates the lead portion that would be removed in such an embodiment). Such a trimmed embodiment would result in two usable leads 114' and 118' for two-wire sensor applications, although it will be appreciated that other number of leads using similar no connect lead techniques are possible. In one such an embodiment, the passive component 164 (FIG. 6) could be a resistor, the passive component 160 could be a capacitor, and the passive component 240 could be a capacitor, thereby providing a different passive network without increasing the package diameter. In other embodiments different combinations of resistors, inductors, capacitors, or diodes (including zener diodes) may be utilized.

Figure 10:
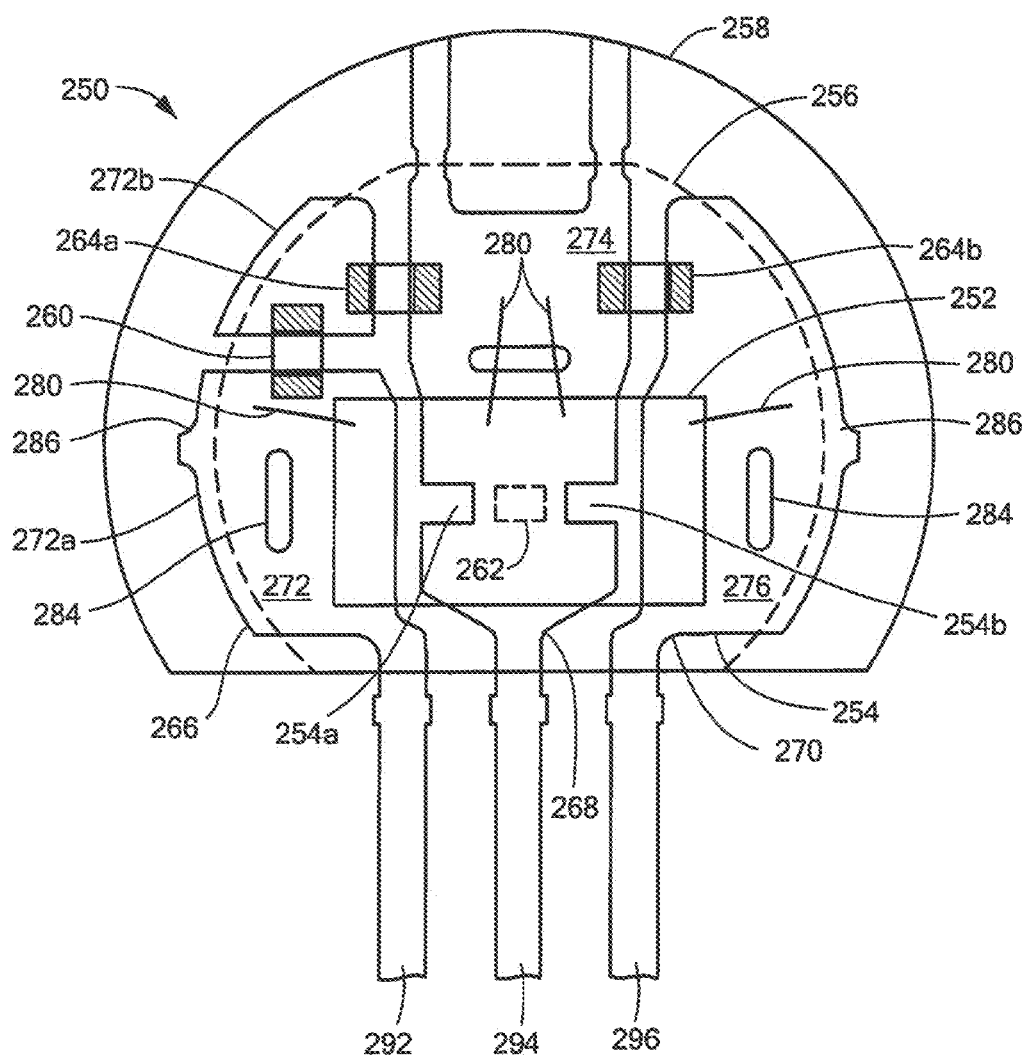
FIG. 10 is a plan view of an alternative packaged magnetic field sensor integrated circuit.

Referring also to FIG. 10, an alternative packaged magnetic field sensor integrated circuit 250 includes a semiconductor die 252, a magnetic field sensing element 262, and a split lead frame 254. The split lead frame 254 includes leads 266, 268, and 270, at least two of which (and here all three of which) include a respective die attach portion 272, 274, 276 and connection portion 292, 294, 296 (only partially shown in the view of FIG. 10).

Here, the die 252 is attached to the top of the lead frame 254 and more particularly is attached to die attach portions 266, 268, 270, with a non-conductive adhesive, such as an epoxy or tape. The leads 266, 268, 270 are electrically coupled to the die 252 by wire bonds 280, as shown. However, other electrical connecting mechanisms, such as solder balls, solder bumps, and pillar bumps, may be suitable in embodiments in which the die 252 is mounted with its active surface (in which the magnetic field sensing element 262 is disposed) adjacent to the lead frame as described above in a flip-chip type of arrangement.

The connection portion 292, 294, 296 of the leads extends from a first end proximate to the respective die portion 266,

268, 270 to a second, distal end (not shown) distal from the die portion. Generally, the connection portion 292, 294, 296 of the leads is elongated and is suitable for electrical connection to electronic components or systems (not shown) outside of the integrated circuit package, such as by soldering to a printed circuit board.

The sensor 250 further includes at least one integrated passive component, and here two such components in the form of capacitors 264a, 264b, attached across respective pairs of die attach portions 272, 274 and 274, 276. The capacitors 264a, 264b may be the same as or similar to capacitor 60 of FIG. 2.

The integrated circuit 250 further includes a passive component coupled in series, or "in-line" with at least one lead. To this end, a lead die attach portion 272 includes at least two separate portions 272a and 272b, one 272a of which forms the die attach portion to which a die 252 is attached and the other 272b of which does not have a die attached thereto, which portions 272a, 272b are coupled together through one or more passive components 260. More particularly, each of the lead portions 272a and 272b has an end that is spaced from and proximate to the end of the other lead portion. Passive component 260 is coupled to both the lead portion 272a and to lead portion 272b, thereby being electrically connected in series with the lead. This arrangement can advantageously permit series coupling of passive components with one or more leads.

The passive component 260 may take various forms, such as a resistor, capacitor, inductor, or diode as examples, which component(s) is provided for various purposes, such as to improve EMC performance. In one embodiment, the passive component 260 is a resistor. It will be appreciated that in embodiments in which the passive component 260 is a capacitor, AC voltages can be applied. Also, it will be appreciated that while only one lead is shown to have an in-line passive component 260, the same or a different type of passive component can be similarly coupled in-line with more than one lead. Also, a single lead die attach portion, such as that formed by lead portions 272a and 272b, can have more than one break and more than one passive component coupled across the respective breaks so as to form an arrangement in which more than one passive component is coupled in series with a respective lead.

The lead frame 254 contains one or more slots, and here two slots 254a and 254b. As is well known in the art, in the presence of a changing, AC or transient magnetic field (e.g., a magnetic field surrounding a current carrying conductor), eddy currents can be induced in the conductive lead frame 254. The presence of the slots can move the position of the eddy currents and also influence the eddy currents to result in a smaller magnetic field error so that a Hall effect element experiences a smaller magnetic field from the eddy currents than it would otherwise experience, resulting in less error in the measured field. Furthermore, if the magnetic field associated with the eddy current is not uniform or symmetrical about the Hall effect element, the Hall effect element might generate an undesirable offset voltage.

Lead frame slots 254a, 254b tend to reduce a size (e.g., a diameter or path length) of the closed loops and the position of the loops with respect to the sensing element(s) in which the eddy currents travel in the lead frame 254. It will be understood that the reduced size of the closed loops in which the eddy currents travel results in smaller eddy currents for a smaller local affect on the changing magnetic field that induced the eddy current. Therefore, the measured magnetic field of a sensor having a Hall effect 262 element is less affected by eddy currents due to the slots 254a, 254b.

Instead of an eddy current rotating about the Hall effect element 262, the slot(s) 254a, 254b result in eddy currents to each side of the Hall element. While the magnetic fields resulting from the eddy currents are additive, the overall magnitude field strength, compared to a single eddy current with no slot, is lower due to the increased distance of the eddy currents to the sensing element(s).

It is understood that any number of slots can be formed in a wide variety of configurations to meet the needs of a particular application. In the illustrative embodiment of FIG. 10, slots 254a, 254b are formed in the die attach portion 274 of lead 268, however, it will be appreciated by those of ordinary skill in the art that other numbers and arrangements of slots are possible. The slots reduce the eddy current flows and enhance the overall performance of the sensor.

It is understood that the term slot should be broadly construed to cover generally interruptions in the conductivity of the lead frame. For example, slots can include a few relatively large holes as well as smaller holes in a relatively high density. In addition, the term slot is not intended to refer to any particular geometry. For example, slot includes a wide variety of regular and irregular shapes, such as tapers, ovals, etc. Further, it is understood that the direction of the slot(s) can vary. Also, it will be apparent that it may be desirable to position the slot(s) based upon the type of sensor.

Additional details of the slotted lead frame may be found in U.S. Patent Application Publication No. US-2012-0086090-A1 for example, which application is assigned to the assignee of the subject invention and incorporated herein by reference in its entirety.

The integrated circuit 250 further includes a non-conductive mold material 256. The non-conductive mold material 256 encloses the die 252, at least a portion of the lead frame 254, and the capacitors 264a, 264b. Optionally, the integrated circuit 250 may further include a ferromagnetic mold material 258. And the sensor may include a third, overmold material, not shown here.

In use, the magnetic field sensor 250 may be positioned in proximity to a moveable magnetically permeable ferromagnetic article, or target (not shown), such that the magnetic field transducer 262 is adjacent to the article and is thereby exposed to a magnetic field altered by movement of the article. The magnetic field transducer 262 generates a magnetic field signal proportional to the magnetic field. The ferromagnetic article may be comprised of a hard ferromagnetic, or simply hard magnetic material (i.e., a permanent magnet such as a segmented ring magnet), a soft ferromagnetic material, or even an electromagnet and embodiments described herein may be used in conjunction with any such article arrangement.

In embodiments in which the article is comprised of a soft ferromagnetic material, the ferromagnetic mold material 258 is comprised of a hard ferromagnetic material to form a bias magnet; whereas in embodiments in which the article is comprised of a hard ferromagnetic material, the ferromagnetic mold material 258 may be soft ferromagnetic material to form a concentrator, or a hard magnetic material where a bias field is desired (for example, in the case of a magnetoresistance element that is biased with a hard magnetic material or permanent magnet). In embodiments in which the ferromagnetic mold material 258 comprises a hard ferromagnetic material to form a bias magnet and in which the sensor 250 is oriented relative to the target such that transducer 262 is closer to the target than the ferromagnetic mold material 258 as shown, the bias magnet may be referred to as a back bias magnet.

The non-conductive mold material 256 is comprised of a non-conductive material so as to electrically isolate and mechanically protect the die 252 and the enclosed portion of the lead frame 254. Suitable materials for the non-conductive mold material 256 include thermoset and thermoplastic mold compounds and other commercially available IC mold compounds. It will be appreciated that the non-conductive mold material 256 can contain a ferromagnetic material, such as in the form of ferromagnetic particles, as long as such material is sufficiently non-conductive.

The non-conductive mold material 256 is applied to the lead frame/die subassembly, such as in a first molding step, to enclose the die 252 and a portion of the lead frame 254. The shape and dimensions of the non-conductive mold material are selected to suit particular IC package requirements.

In some embodiments as noted above, the ferromagnetic mold material 258 is comprised of a hard or permanent magnetic material to form a bias magnet. As will be apparent to those of ordinary skill in the art, various materials are suitable for providing the ferromagnetic mold material 258 depending on the operating temperature range and final package size. In some embodiments, it may be desirable for the ferromagnetic mold material to have a coercivity larger than its remanence.

Illustrative hard magnetic materials for the ferromagnetic mold material include, but are not limited to hard magnetic ferrites, SmCo alloys, NdFeB alloy materials, or PLASTIFORM® bonded magnet materials of Arnold Magnetic Technologies Corp., or other plastic compounds with hard magnetic particles, for example a thermoset polymer such as polyphenylene sulfide material (PPS) or nylon material containing SmCo, NdFeB, or hard ferromagnetic ferrite magnetic particles; or a thermoset polymer such as SUMIKON®EME thermoset polymer of Sumitomo Bakelite Co., Ltd or similar type of thermoset mold material containing hard magnetic particles. In some embodiments it may be desirable to align the hard ferromagnetic particles during molding to form a more anisotropic or directional permanent magnetic material by molding in the presence of a magnetic field; whereas, in other embodiments, a sufficient magnet may result without an alignment step during molding for isotropic materials. It will be appreciated that a NdFeB or a SmCo alloy may contain other elements to improve temperature performance, magnetic coercivity, or other magnetic properties useful to a magnetic design.

In other embodiments, the ferromagnetic mold material 258 is comprised of a soft ferromagnetic material to form a concentrator. As will be apparent to those of ordinary skill in the art, various materials are suitable for providing the ferromagnetic mold material 258 in the form of a soft ferromagnetic material. In some embodiments, it may be desirable for the soft ferromagnetic mold material to have a relatively low coercivity and high permeability. Suitable soft ferromagnetic materials include, but are not limited to permalloy, NiCo alloys, NiFe alloys, steel, nickel, and soft ferromagnetic ferrites.

The ferromagnetic mold material 258 is secured to the non-conductive mold material 256, such as in a molding step or with an adhesive, such as a thermoset adhesive (e.g., a two part epoxy).

In some embodiments, a portion of the non-conductive mold material 256 that contacts the ferromagnetic mold material 258 and/or the portion of the ferromagnetic mold material that contacts the non-conductive mold material has a securing mechanism in order to improve the adhesion between the two materials and to prevent or reduce lateral slippage or shear between the materials. As one example, overhanging portions 286 of the lead frame that extend beyond the non-conductive mold material 256, serve to enhance adhesion of the non-conductive mold material 256 to the ferromagnetic mold material 258 and the lead frame. Because the overhanging portions 286 of the lead frame extend into the ferromagnetic mold material, it will be appreciated that the ferromagnetic mold material should be non-conductive or have a sufficiently low conductivity to prevent the leads from electrically shorting resulting in the device not operating as intended. Slots 284 in the lead frame 254 also serve to enhance adhesion of the non-conductive mold material 256 to the lead frame 254.

It will be appreciated by those of ordinary skill in the art, that various types of processes may be used to form the mold materials including but not limited to molding, such as compression molding, injection molding, and transfer molding, and potting. Furthermore, combinations of the various techniques for forming the mold materials are possible.

A mold cavity used to define the ferromagnetic mold material 258 may include a mandrel so that the ferromagnetic mold material forms a ring-shaped structure having a central aperture. The mold material 258 may form a conventional O-shaped ring structure or a D-shaped structure. Alternatively, the ferromagnetic mold material 258 may form only a partial ring-like structure, as may be described as a "C" or "U" shaped structure. More generally, the ferromagnetic mold material 258 may comprise a non-contiguous central region such that the central region is not formed integrally with its outer region. Such central region may be an open area, may contain a ferromagnetic material, or a separately formed element such as a steel rod for example.

Additional features of the mold materials 256, 258 are possible. For example, the non-conductive mold material 256 may include a protrusion extending into a portion of the ferromagnetic mold material 258 and certain tapers may be provided to the ferromagnetic mold material.

Having described preferred embodiments of the invention it will now become apparent to those of ordinary skill in the art that other embodiments incorporating these concepts may be used.

For example, it will be appreciated by those of ordinary skill in the art that the package types, shapes, and dimensions, including but not limited to the thicknesses of the mold materials, can be readily varied to suit a particular application both in terms of the electrical and magnetic requirements as well as any packaging considerations. It will also be appreciated that the various features shown and described herein in connection with the various embodiments can be selectively combined.

Accordingly, it is submitted that that the invention should not be limited to the described embodiments but rather should be limited only by the spirit and scope of the appended claims. All publications and references cited herein are expressly incorporated herein by reference in their entirety.

What is claimed is:

1. A magnetic field sensor comprising:
  a lead frame having a first surface, a second opposing surface, and comprising a plurality of leads, wherein at least two of the plurality of leads are electrically isolated from each other and wherein each of the at least two leads has an elongated connection portion extending from a die attach portion;

a semiconductor die supporting a magnetic field sensing element and attached to the die attach portions of the at least two leads;

a passive component coupled between the die attach portions of the at least two leads; and a non-conductive adhesive between the semiconductor die and the die attach portions of the at least two leads.

2. The magnetic field sensor of claim 1 further comprising a non-conductive mold material enclosing the semiconductor die and the die attach portions of the at least two leads.

3. The magnetic field sensor of claim 2 further comprising a ferromagnetic mold material secured to a portion of the non-conductive mold material.

4. The magnetic field sensor of claim 1 wherein the passive component is a capacitor.

5. The magnetic field sensor of claim 1 further comprising at least two passive components, each coupled between a respective pair of die attach portions.

6. The magnetic field sensor of claim 1 further comprising a second passive component coupled to the connection portion of the at least two leads.

7. The magnetic field sensor of claim 1 wherein the connection portion of at least one of the at least two leads has a widened portion extending away from another one of the at least two leads.

8. The magnetic field sensor of claim 1 further comprising a wire bond coupled between the semiconductor die and a location of the die attach portion of at least one of the at least two leads distal from the connection portion of the at least one lead.

9. The magnetic field sensor of claim 1 further comprising a wire bond coupled between the semiconductor die and a location of the die attach portion of at least one of the at least two leads proximate to the connection portion of the at least one lead.

10. The magnetic field sensor of claim 1 wherein at least one of the plurality of leads has a first portion that is separated from a second portion of the lead and wherein the magnetic field sensor further comprises a passive component coupled between the first portion and second portion of the at least one lead.

11. The magnetic field sensor of claim 10 wherein the passive component is a resistor.

12. The magnetic field sensor of claim 10 wherein the semiconductor die is attached to the first portion of the at least one lead and is not attached to the second portion of the at least one lead.

13. The magnetic field sensor of claim 1 wherein the die attach portion of at least one of the at least two leads comprises at least one slot.

14. The magnetic field sensor of claim 1 further comprising a ferromagnetic mold material secured to the elongated connection portion of at least one of the plurality of leads.

15. The magnetic field sensor of claim 1 further comprising a ferromagnetic bead secured to the connection portion of at least one of the plurality of leads.

16. The magnetic field sensor of claim 1 wherein the semiconductor die has a first surface in which the magnetic field sensing element is disposed and a second, opposing surface and wherein the second, opposing surface is attached to the die attach portions of the at least two leads.

17. A magnetic field sensor comprising:

a lead frame having a first surface, a second opposing surface, and comprising a plurality of leads, wherein at least two of the plurality of leads are electrically isolated from each other and wherein each of the at least two leads has an elongated connection portion extending from a die attach portion;

a semiconductor die supporting a magnetic field sensing element and attached to the die attach portions of the at least two leads;

a passive component coupled between the die attach portions of the at least two leads; and a non-conductive mold material enclosing the semiconductor die and the die attach portions of the at least two leads, wherein the non-conductive mold material has a diameter of less than approximately 7.0 mm.

18. The magnetic field sensor of claim 17 wherein the passive component is a capacitor.

19. A magnetic field sensor comprising:

a lead frame comprising a plurality of leads, wherein at least two of the plurality of leads are electrically isolated from each other and wherein each of the at least two leads has an elongated connection portion extending from a die attach portion;

a semiconductor die supporting a magnetic field sensing element and attached to the die attach portions of the at least two leads;

a non-conductive adhesive between the semiconductor die and the die attach portions of the at least two leads;

at least one passive component coupled between the die attach portions of the at least two leads;

a non-conductive mold material enclosing the semiconductor die, the passive component, and the die attach portions of the at least two leads; and a ferromagnetic mold material secured to a portion of the non-conductive mold material.

20. The magnetic field sensor of claim 19 wherein the at least one passive component is a capacitor.

21. The magnetic field sensor of claim 19 further comprising at least two passive components, each coupled between a respective pair of die attach portions.

22. The magnetic field sensor of claim 19 further comprising at least one passive component coupled to the connection portion of the at least two leads.

23. The magnetic field sensor of claim 19 wherein the connection portion of at least one of the at least two leads has a widened portion extending away from another one of the at least two leads.

24. The magnetic field sensor of claim 19 further comprising a wire bond coupled between the semiconductor die and a location of the die attach portion of at least one of the at least two leads distal from the connection portion of the at least one lead.

25. The magnetic field sensor of claim 19 further comprising a wire bond coupled between the semiconductor die and a location of the die attach portion of at least one of the at least two leads proximate to the connection portion of the at least one lead.

26. The magnetic field sensor of claim 19 wherein at least one of the plurality of leads has a first portion that is separated from a second portion of the lead and wherein the magnetic field sensor further comprises at least one passive component coupled between the first portion and second portion of the at least one lead.

27. The magnetic field sensor of claim 26 wherein the at least one passive component is a resistor.

28. The magnetic field sensor of claim 19 wherein the die attach portion of at least one of the at least two leads comprises at least one slot.

29. The magnetic field sensor of claim 19 further comprising a ferromagnetic mold material secured to the elongated connection portion of at least one of the plurality of leads.

30. The magnetic field sensor of claim 19 further comprising a ferromagnetic bead secured to the connection portion of at least one of the plurality of leads.

* * * * *

UNITED STATES PATENT AND TRADEMARK OFFICE
CERTIFICATE OF CORRECTION

PATENT NO. : 9,494,660 B2  
APPLICATION NO. : 13/749776  
DATED : November 15, 2016  
INVENTOR(S) : Paul David et al.

Page 1 of 1

It is certified that error appears in the above-identified patent and that said Letters Patent is hereby corrected as shown below:

Column 8, Line 61, delete "ends 134a," and replace with --ends 134b,--

Column 9, Line 44, delete "mount capacitor" and replace with --mount capacitors--

Signed and Sealed this
Eighth Day of May, 2018

Andrei Iancu
*Director of the United States Patent and Trademark Office*